(12) United States Patent
Fujii et al.

(10) Patent No.: US 8,759,926 B2
(45) Date of Patent: Jun. 24, 2014

(54) SEMICONDUCTOR PHYSICAL QUANTITY SENSOR

(75) Inventors: Tetsuo Fujii, Toyohashi (JP); Keisuke Gotoh, Obu (JP)

(73) Assignee: DENSO CORPORATION, Kariya (JP)

( * ) Notice: Subject to any disclaimer, the term of this patent is extended or adjusted under 35 U.S.C. 154(b) by 203 days.

(21) Appl. No.: 13/033,941

(22) Filed: Feb. 24, 2011

(65) Prior Publication Data

US 2011/0227174 A1    Sep. 22, 2011

(30) Foreign Application Priority Data

Mar. 17, 2010  (JP) .................................. 2010-60565

(51) Int. Cl.
*G11C 11/15* (2006.01)
(52) U.S. Cl.
USPC ........... 257/414; 257/415; 257/417; 257/418; 257/419; 257/420; 257/E29.324
(58) Field of Classification Search
USPC .................... 257/414, 415, 417–420, E29.324
See application file for complete search history.

(56) References Cited

U.S. PATENT DOCUMENTS

| | | | | |
|---|---|---|---|---|
| 5,987,989 | A * | 11/1999 | Yamamoto et al. | ........ 73/514.24 |
| 6,028,332 | A | 2/2000 | Kano et al. | |
| 6,649,987 | B1 * | 11/2003 | Staker et al. | .................. 257/417 |
| 7,642,657 | B2 * | 1/2010 | Suilleabhain et al. | ........ 257/778 |
| 2003/0113979 | A1 | 6/2003 | Bieck et al. | |
| 2005/0061075 | A1 * | 3/2005 | Sugiura | ...................... 73/514.32 |
| 2007/0099395 | A1 | 5/2007 | Sridhar et al. | |
| 2009/0008728 | A1 | 1/2009 | Fujii et al. | |
| 2009/0134459 | A1 | 5/2009 | Goto et al. | |
| 2009/0140357 | A1 * | 6/2009 | Kupnik et al. | ................. 257/416 |
| 2009/0206349 | A1 | 8/2009 | Yamada et al. | |
| 2009/0261430 | A1 * | 10/2009 | Suzuki et al. | ................. 257/417 |

FOREIGN PATENT DOCUMENTS

| | | |
|---|---|---|
| EP | 1 953 814 | 8/2008 |
| JP | A-2008-288384 | 11/2008 |
| JP | A-2009-16717 | 1/2009 |

OTHER PUBLICATIONS

Office Action mailed Oct. 9, 2012 by the Japanese Patent Office in a corresponding Japanese patent application No. 2010-060565 (English translation attached).
Office Action mailed Feb. 14, 2012 issued in corresponding JP patent application No. 2010-060565 (English translation attached).

\* cited by examiner

*Primary Examiner* — Michael Shingleton
(74) *Attorney, Agent, or Firm* — Posz Law Group, PLC

(57) ABSTRACT

In a semiconductor physical quantity sensor, a pattern portion including a wiring pattern as a wiring is formed on a surface of a first semiconductor substrate. A support substrate having a surface made of an electrically insulating material is prepared. The first semiconductor substrate is joined to the support substrate by bonding the pattern portion to the surface of the support substrate. Further, a sensor structure is formed in the first semiconductor substrate. The sensor structure is electrically connected to the wiring pattern. A cap is bonded to the first semiconductor substrate such that the sensor structure is hermetically sealed.

3 Claims, 37 Drawing Sheets

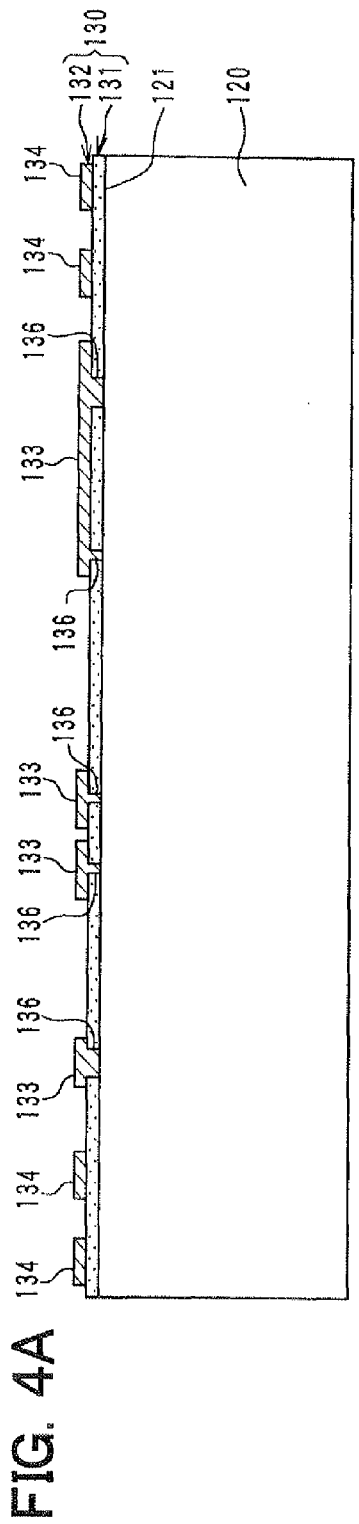
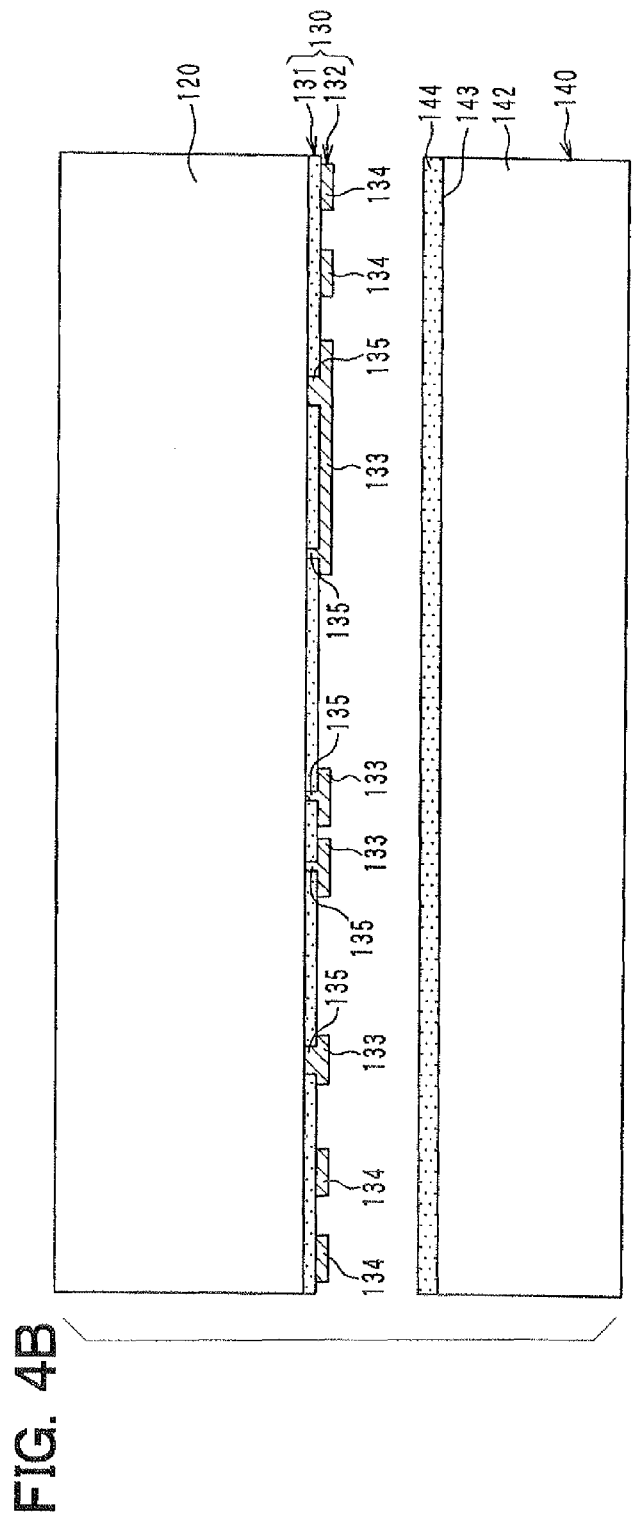
FIG. 4A
FIG. 4B

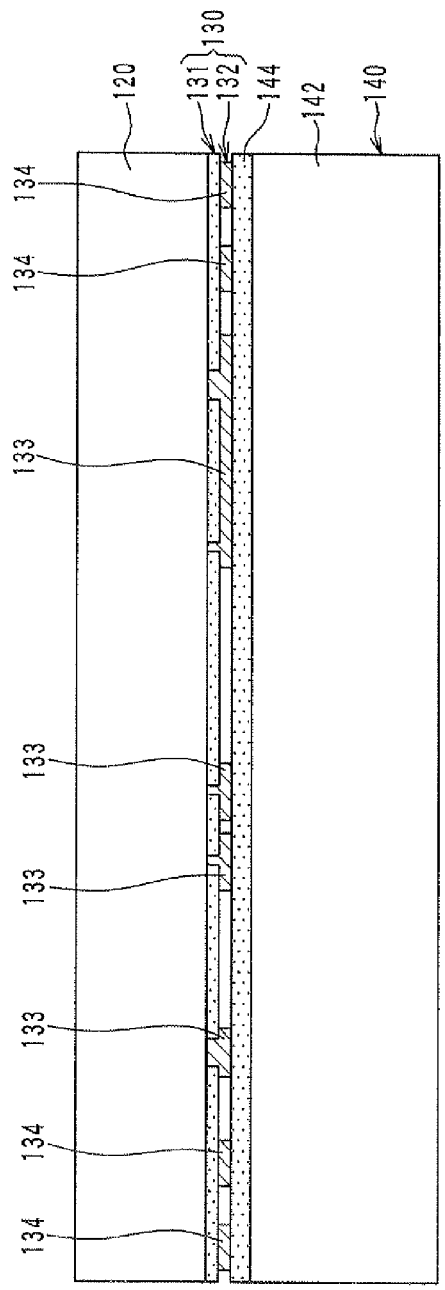
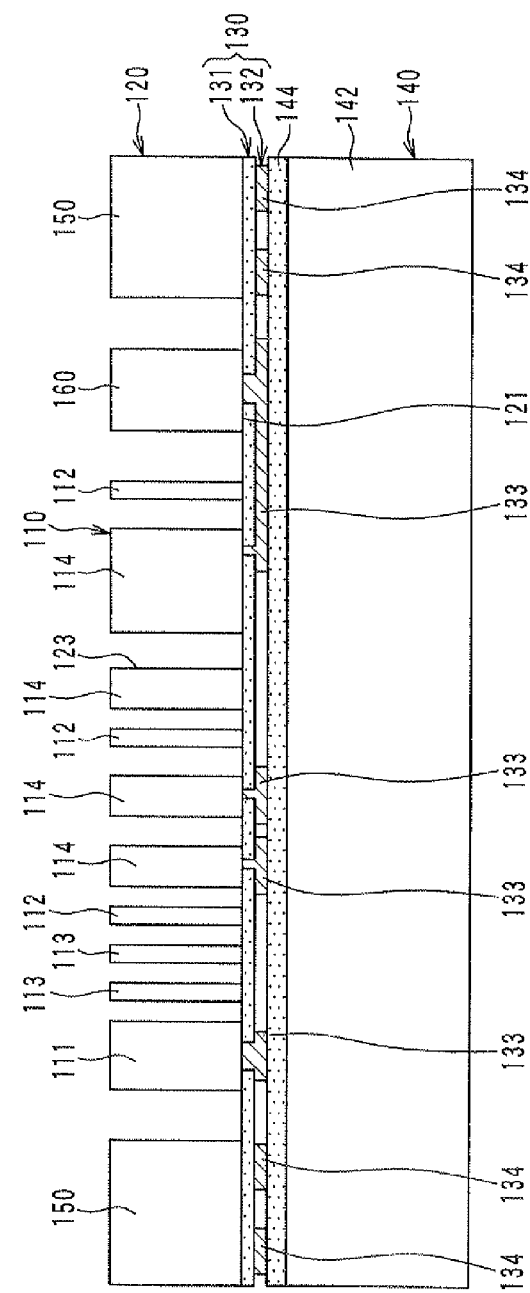

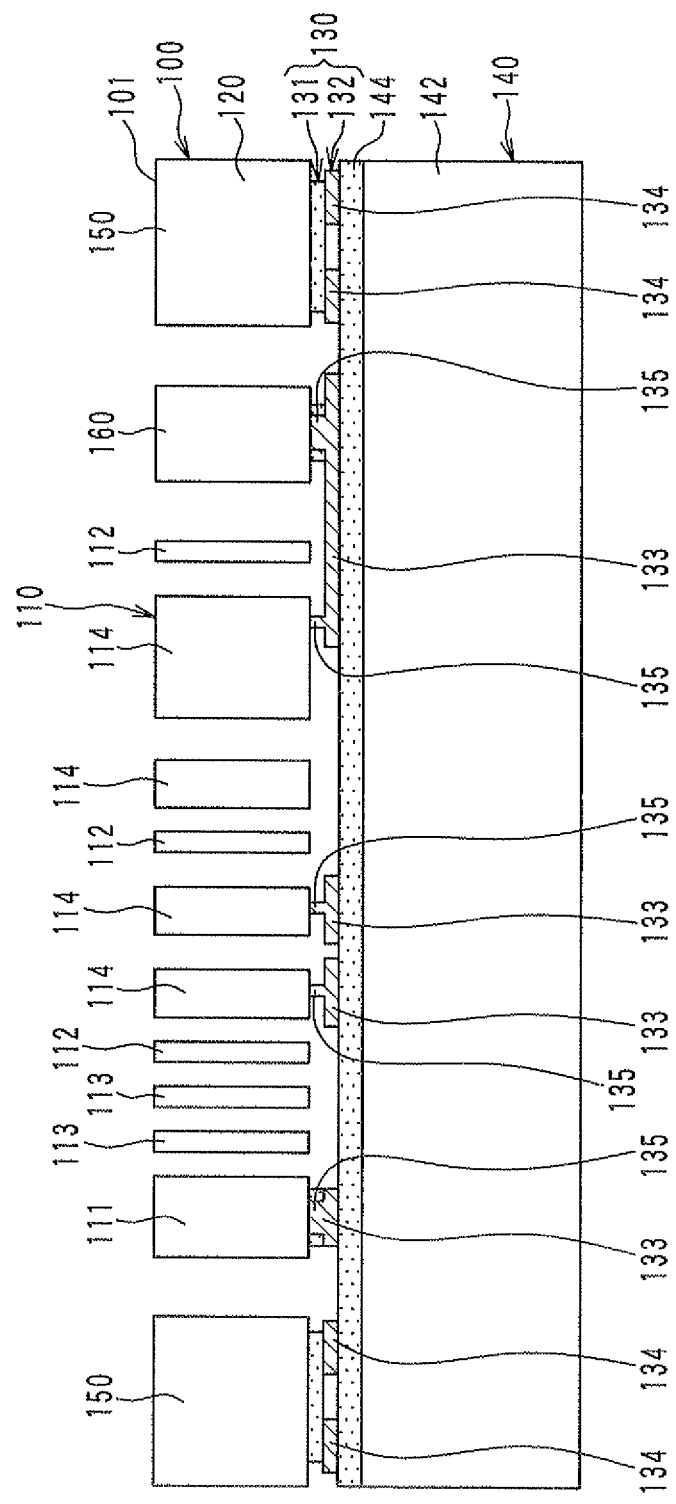

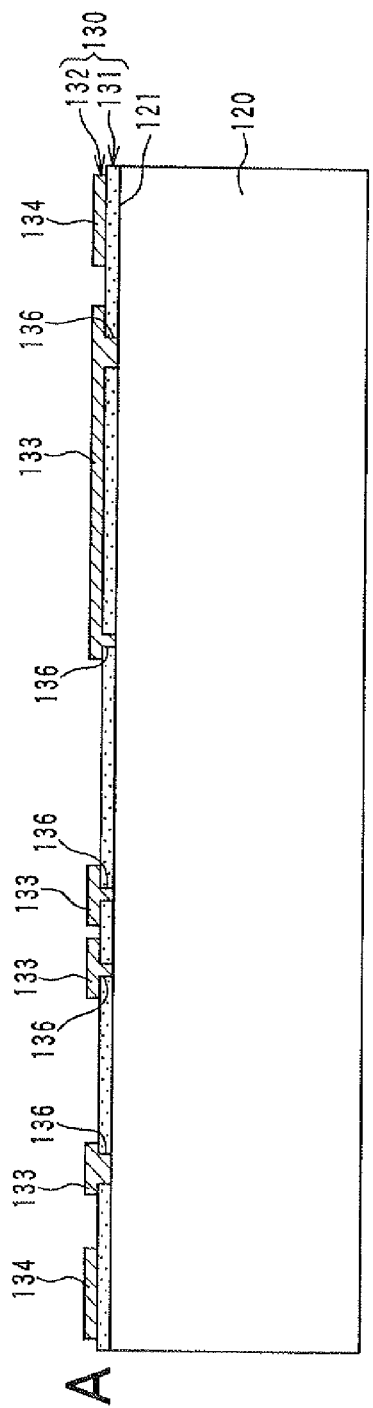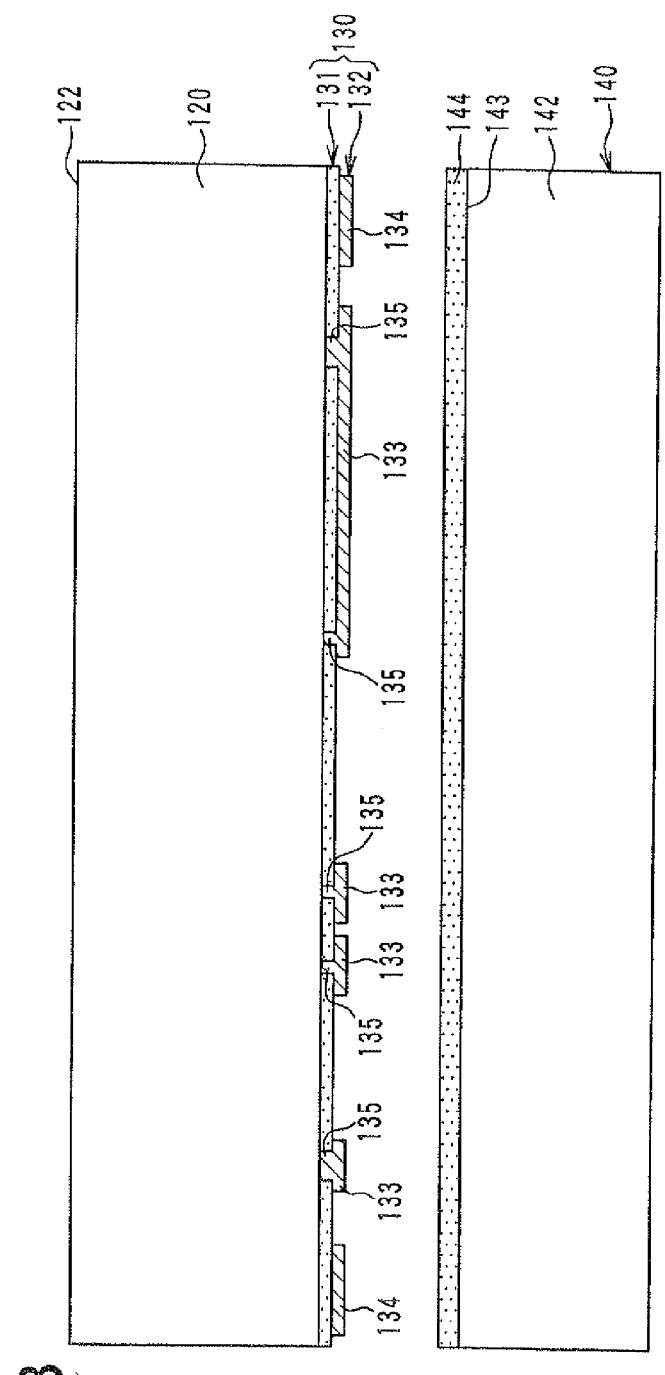
FIG. 18A
FIG. 18B

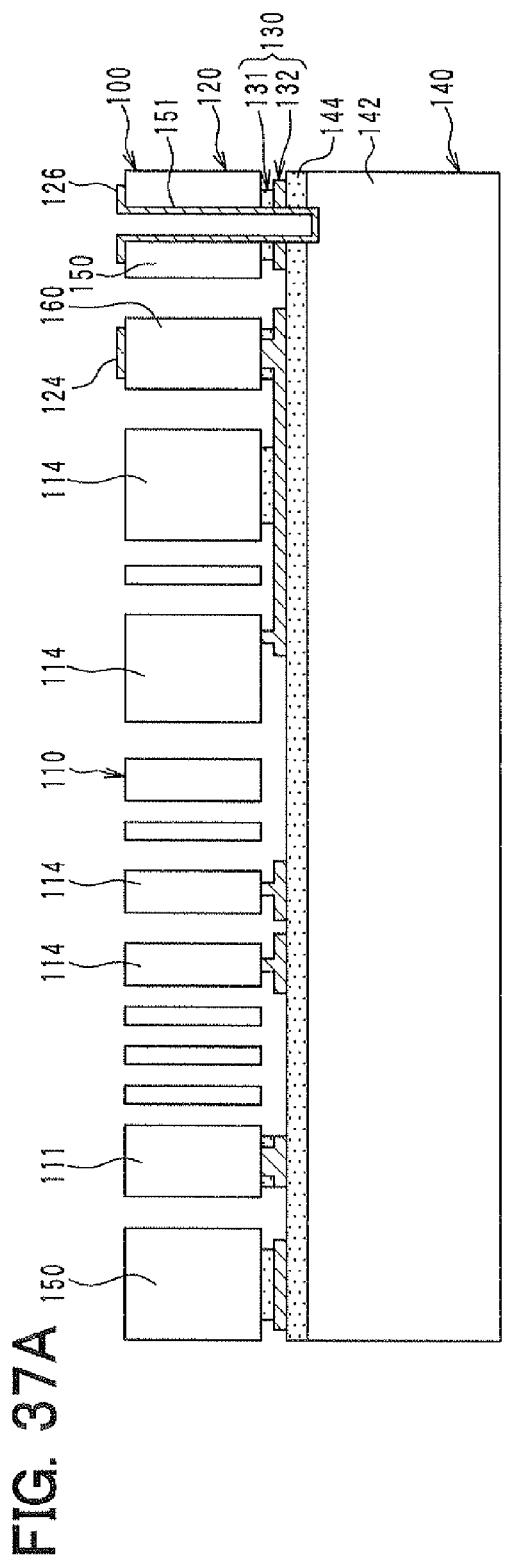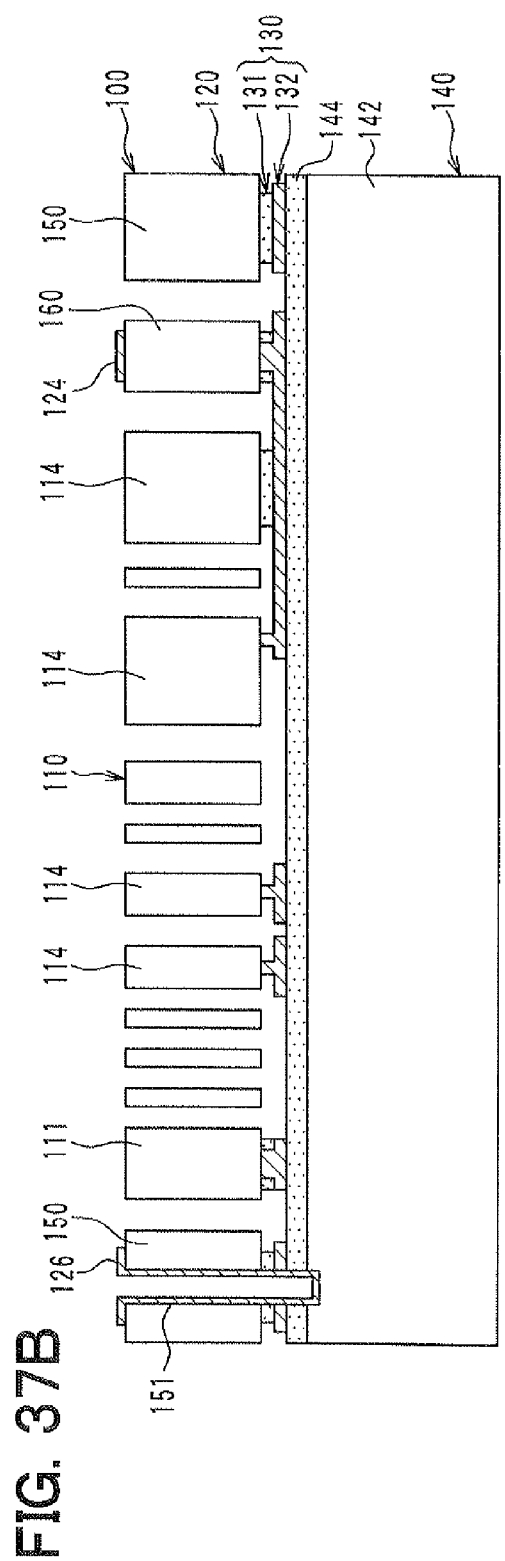

SEMICONDUCTOR PHYSICAL QUANTITY SENSOR

CROSS REFERENCE TO RELATED APPLICATION

This application is based on Japanese Patent Application No. 2010-60565 filed on Mar. 17, 2010, the disclosure of which is incorporated herein by reference.

FIELD OF THE INVENTION

The present invention relates to a semiconductor physical quantity sensor and a method of manufacturing the same.

BACKGROUND OF THE INVENTION

A semiconductor physical quantity sensor constructed by joining two substrates has been proposed. For example, Japanese Patent Application Publication No. 11-267777 (counterpart U.S. Pat. No. 6,028,332) describes a semiconductor-type yaw rate sensor in which a lower wiring layer is formed on a substrate and another substrate formed with a beam structure for detecting a yaw rate is laid on the lower wiring layer.

Such a yaw rate sensor is manufactured in the following manner. First, a first polycrystalline silicon layer as the lower wiring layer is formed on a first silicon substrate. Next, the first polycrystalline silicon layer is patterned into a wire shape. Then, an insulating layer is formed on the surface of the patterned first polycrystalline silicon layer for electrically insulating the wiring from the beam structure.

Thereafter, a second polycrystalline silicon layer is formed above the insulating layer so as to fill projections and grooves at the surface of the insulating layer. Next, the surface of the second polycrystalline silicon layer is flattened such as by mechanical polishing or the like in order to enhance attachment of a second silicon substrate thereto. Then, the second silicon substrate is attached to the flattened surface of the second polycrystalline silicon layer. Further, the second silicon substrate is thinned by mechanical polishing or the like. Thus, a support substrate is prepared.

Thereafter, the first silicon substrate is thinned by mechanical polishing or the like, and the beam structure is formed in the thinned first silicon substrate by a photolithography and etching process. Further, the insulating film located between a movable portion of the beam structure and the second silicon substrate is removed such that the movable portion is movable relative to a fixed portion of the beam structure. In this way, the semiconductor-type yaw rate sensor is manufactured.

Such a manufacturing process begins preparation of the first silicon substrate in which the beam structure is to be formed, and includes forming of the lower wiring layer on the first silicon substrate and the like and joining the second silicon substrate to the first silicon substrate. Therefore, the process is long, and a layer structure is complicated.

Particularly, since the second silicon substrate is joined to the second polycrystalline silicon layer, which is layered on the insulating layer covering the lower wiring layer of the first silicon substrate, it is necessary to flatten the second polycrystalline silicon layer. Fatness of the surface of the second polycrystalline silicon layer is likely to affect a characteristic of the semiconductor yaw rate sensor. It is difficult stably manufacture the semiconductor-type yaw rate sensors to have stable characteristics.

Such a drawback is not limited to the semiconductor-type yaw rate sensor, but is likely to be caused in semiconductor physical quantity sensors constructed by joining two substrates in the similar manner.

SUMMARY OF THE INVENTION

The present invention is made in view of the foregoing matter, and it is an object of the present invention to provide a method of manufacturing a semiconductor physical quantity sensor, which is capable of shortening a manufacturing process and simplifying a layer structure. It is another object of the present invention to provide a semiconductor physical quantity sensor including a sensor unit with a simplified layer structure.

In a manufacturing method according to an aspect, a pattern portion including a wiring pattern as a wiring is formed on a surface of a first semiconductor substrate. A support substrate having a surface made of an electrically insulating material is prepared. The first semiconductor substrate and the support substrate are joined to each other by opposing the pattern portion to the surface of the support substrate and bonding the pattern portion to the surface of the support substrate. Further, a sensor structure electrically connected to the wiring pattern is formed in the first semiconductor substrate.

In this method, the first semiconductor substrate is bonded to the support substrate by bonding the pattern portion, which is previously formed on the surface of the first semiconductor substrate, to the support substrate. Therefore, it is not necessary to form a thin film on the first semiconductor substrate for bonding the first semiconductor substrate to the support substrate and to flatten the thin film. Further, the first semiconductor substrate and the support substrate are layered through the pattern portion. Accordingly, a manufacturing process is shortened and a simple layer structure is produced.

In a semiconductor physical quantity sensor according to a second aspect, a sensor unit has a sensor structure at a surface layer portion thereof, and a cap having a substantially plate shape is bonded to the sensor unit to hermetically seal the sensor structure. The sensor unit includes a support substrate, a first semiconductor substrate, and a pattern portion between the support substrate and the first semiconductor substrate. The support substrate has a surface made of an electrically insulating material. The first semiconductor substrate is divided into a predetermined shape to include the sensor structure, a sensor peripheral portion having a loop shape entirely surrounding a periphery of the sensor structure, and a connector portion disposed in an area surrounded by the sensor peripheral portion. The pattern portion is disposed along a surface of the first semiconductor substrate. The pattern portion includes a wiring pattern as a wiring that electrically connects the sensor structure and the connector portion and a peripheral pattern that has a loop shape entirely surrounding a periphery of the sensor structure. The first semiconductor substrate is joined to the support substrate by bonding the wiring pattern and the peripheral pattern to the surface of the support substrate.

In the semiconductor physical quantity sensor, only the pattern portion is disposed between the first semiconductor substrate and the support substrate. Therefore, the layer structure can be simplified.

In a semiconductor physical quantity sensor according to a third aspect, a sensor unit has a sensor structure at a surface layer portion thereof, and a cap having a substantially plate shape is bonded to the sensor unit to hermetically seal the sensor structure. The sensor unit includes a support substrate, a first semiconductor substrate, and a pattern portion between the support substrate and the first semiconductor substrate. The support substrate has a surface made of an electrically insulating material. The first semiconductor substrate is divided into a predetermined shape to include the sensor structure, a sensor peripheral portion, and a connector portion. The sensor peripheral portion has a loop-shaped portion that entirely surrounds a periphery of the sensor structure. The connector portion is disposed outside of the loop-shaped portion. The pattern portion is disposed along a surface of the first semiconductor substrate. The pattern portion includes a wiring pattern as a wiring that electrically connects the sensor structure and the connector portion, and a peripheral pattern that is disposed between the support substrate and the sensor peripheral portion and has a shape surrounding the sensor peripheral portion. The wiring pattern has a first end disposed in an area inside of the loop-shaped portion and electrically connected to the sensor structure, and a second end disposed in an area outside of the loop-shaped portion and electrically connected to the connector portion. The first semiconductor substrate is joined to the support substrate by bonding the wiring pattern and the peripheral pattern to the surface of the support substrate. Further, an electrically insulating member is disposed to seal a space, which is formed by the support substrate, the pattern portion and the loop-shaped portion of the sensor peripheral portion by the forming of the sensor structure, so that the area inside of the loop-shaped portion is separated from the area outside of the loop-shaped portion.

In the semiconductor physical quantity sensor, only the pattern portion is disposed between the first semiconductor substrate and the support substrate. Therefore, the layer structure can be simplified.

In a semiconductor physical quantity sensor according to a fourth aspect, a sensor unit has a sensor structure at a surface layer portion thereof, and a cap having a substantially plate shape is bonded to the sensor unit to hermetically seal the sensor structure. The sensor unit includes a support substrate, a first semiconductor substrate, and a pattern portion between the support substrate and the first semiconductor substrate. The support substrate includes a second semiconductor substrate and an electrically insulating layer disposed along a surface of the second semiconductor substrate. The first semiconductor substrate is divided into a predetermined shape to include the sensor structure, a sensor peripheral portion, and a connector portion. The sensor peripheral portion has a loop-shaped portion that entirely surrounds a periphery of the sensor structure. The connector portion is disposed outside of the loop-shaped portion. The pattern portion is disposed along a surface of the first semiconductor substrate. The pattern portion includes a wiring pattern as a wiring that electrically connects the sensor structure and the connector portion, and a peripheral pattern that is disposed between the support substrate and the sensor peripheral portion and has a shape surrounding the sensor structure. The pattern portion is bonded to the electrically insulating layer of the support substrate by embedding the wiring pattern and the peripheral pattern in the insulating layer. Further, the wiring pattern and the peripheral pattern are embedded in the electrically insulating layer of the support substrate without forming a space between the loop-shaped portion and the electrically insulating layer so that an area inside of the loop-shaped portion is separated from an area outside of the loop-shaped portion.

In the semiconductor physical quantity sensor, only the pattern portion is disposed between the first semiconductor substrate and the support substrate. Therefore, the layer structure can be simplified.

BRIEF DESCRIPTION OF THE DRAWINGS

Other objects, features and advantages of the present invention will become more apparent from the following detailed description made with reference to the accompanying drawings, in which like parts are designated by like reference numbers and in which:

FIGS. 4A, 4B, 5A, 5B, 6, 7 and 8 are cross-sectional views showing a process of manufacturing the semiconductor physical quantity sensor according to the first embodiment;

FIGS. 18A, 18B, 19, 20 and 21 are cross-sectional views showing a process of manufacturing the semiconductor physical quantity sensor according to the fifth embodiment of the present invention;

FIG. 37A is a cross-sectional view of a part of a semiconductor physical quantity sensor according to a sixth modified embodiment of the present invention; and FIG. 37B is a cross-sectional view of a part of a semiconductor physical quantity sensor according to a seventh modified embodiment of the present invention.

DETAILED DESCRIPTION OF EXEMPLARY EMBODIMENTS

Hereinafter, embodiments will be described with reference to the drawings. Like parts are designated with like reference numbers throughout the embodiments.

First Embodiment

Figure 1:
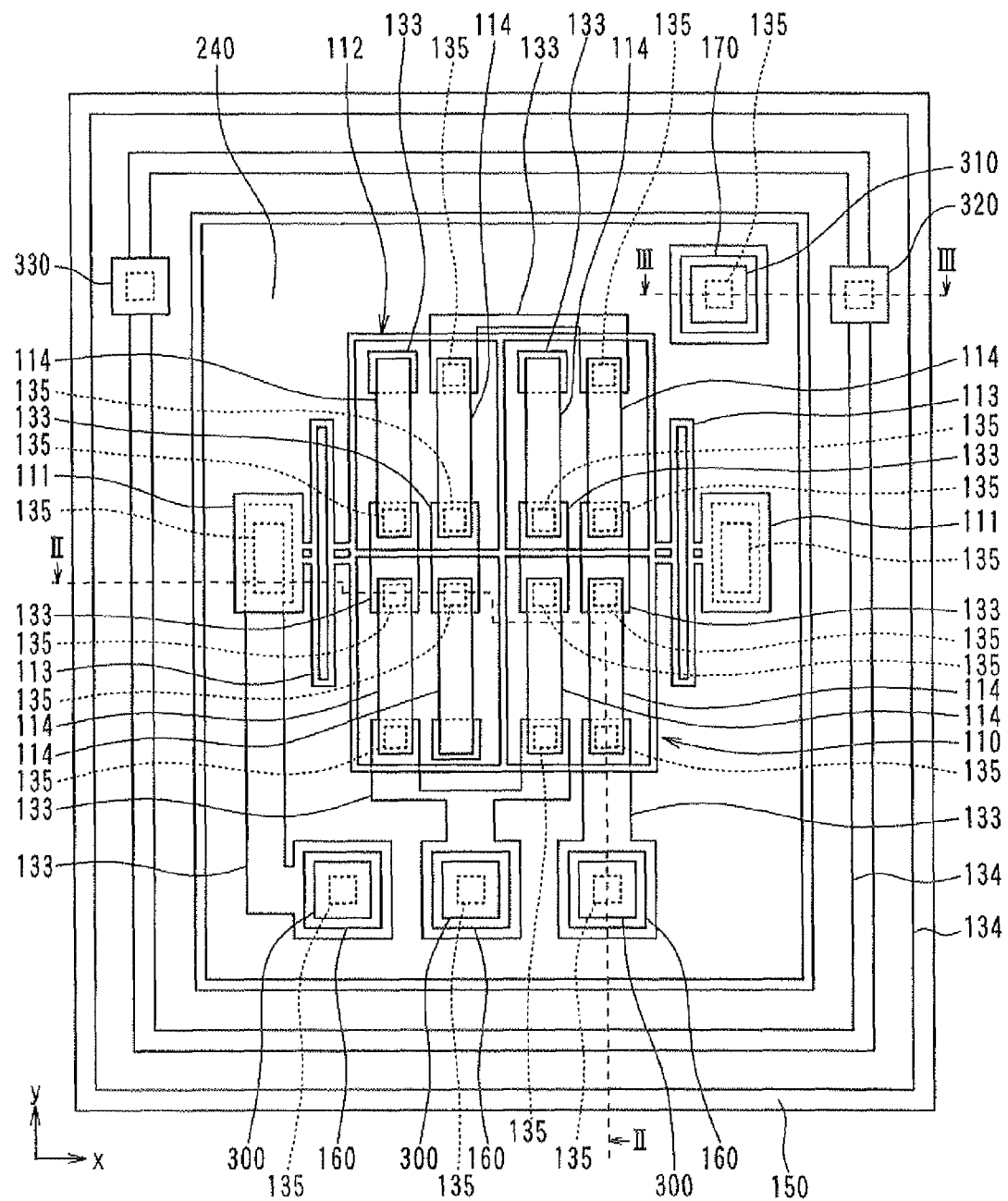
FIG. 1 is a plan view of a semiconductor physical quantity sensor according to a first embodiment of the present invention.
Figure 2:
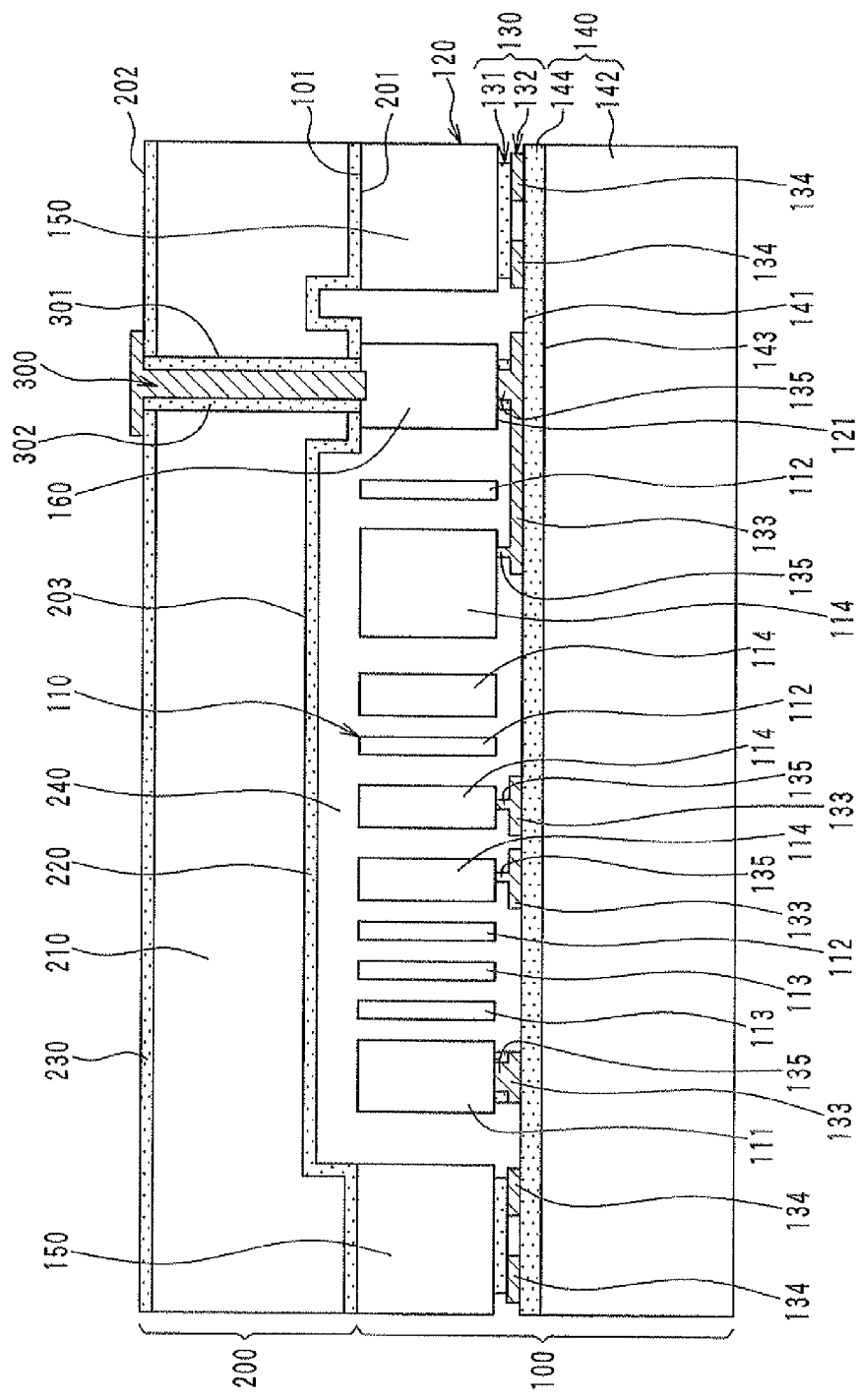
FIG. 2 is a cross-sectional view taken along a line II-II in FIG. 1.
Figure 3:
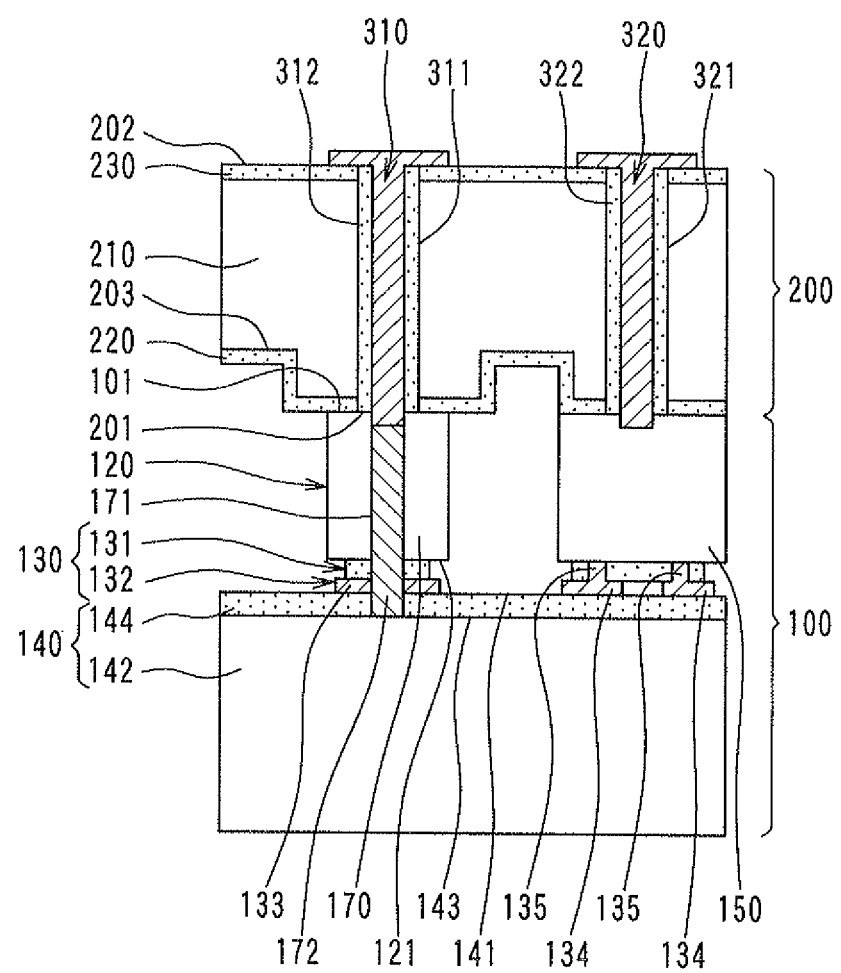
FIG. 3 is a cross-sectional view taken along a line III-III in FIG. 1.

A first embodiment of the present invention will be described hereinafter with reference to the drawings. FIG. 1 is a plan view of a semiconductor physical quantity sensor according to the present embodiment. FIG. 2 is a cross-sectional view taken along a line II-II in FIG. 1. FIG. 3 is a cross-sectional view taken along a line III-III in FIG. 1. A structure of a semiconductor physical quantity sensor according to the present embodiment will be described with reference to FIGS. 1 through 3.

As shown in FIGS. 2 and 3, the semiconductor physical quantity sensor is constructed of a sensor unit 100 and a cap 200, which are bonded to each other. The sensor unit 100 has a generally plate shape including a surface 101. The cap 200 has a generally plate shape including a first surface 201 and a second surface 202 opposite to the first surface 201. The surface 101 of the sensor unit 100 and the first surface 201 of the cap 200 are bonded to each other. FIG. 1 is a plan view in which the cap 200 and some parts are illustrated as transparent to show underneath structures for explanatory purposes.

The sensor unit 100 includes the sensor structure 110 along the surface 101. The sensor structure 110 forms elements for detecting a physical quantity such as an acceleration. The sensor unit 100 generally includes a first semiconductor substrate 120, a pattern portion 130, and a support substrate 140. The pattern portion 130 is formed along a surface 121 of the first semiconductor substrate 120. The pattern portion 130 is directly bonded to a surface 141 of the support substrate 140.

At least the surface 141 of the support substrate 140 is constructed of an electrically insulating material. For example, as shown in FIGS. 2 and 3, the support substrate 140 includes a second semiconductor substrate 142 and a first insulating layer 144, which is made of an electrically insulating material, along a surface 143 of the second semiconductor substrate 142. The surface 141 of the support substrate 140 is provided by the first insulating layer 144.

The pattern portion 130 includes an electrically insulating film 131 disposed along the surface 121 of the first semiconductor substrate 120 and a metal layer 132 disposed along the electrically insulating film 131. The electrically insulating film 131 and the metal layer 132 are respectively patterned into predetermined shapes. The patterned metal layer 132 is bonded to the first insulating layer 144 of the support substrate 140. A structure and a shape of the metal layer 132 will be described later in detail.

As shown in FIG. 1, the first semiconductor substrate 120 is divided into a predetermined shape to include the sensor structure 110, a sensor peripheral portion 150, connector portions 160 and an embedded portion 170. A part of the sensor structure 110, the sensor peripheral portion 150, the connector portions 160 and the embedded portion 170 are supported by the support substrate 140 through the pattern portion 130.

As shown in FIGS. 1 and 2, the sensor structure 110 includes anchors 111, a movable electrode 112, beams 113 and fixed electrodes 114.

The anchors 111 serve to support the movable electrode 112 in a condition that the movable electrode 112 is floated relative to the support substrate 140. For example, each of the anchors 111 has a block shape. The anchors 111 are disposed at two locations on the pattern portion 130.

The movable electrode 112 serves as a weight portion that displaces relative to each of the anchors 111 when an acceleration acts on the semiconductor physical quantity sensor. Also, the movable electrode 112 serves as an electrode. The movable electrode 112 has a frame shape.

For example, the movable electrode 112 has a frame shape that includes a rectangular outer frame and crossed straight bars in the rectangular outer frame. That is, in the rectangular outer frame, a cross is formed. The cross includes a first straight portion extending in an alignment direction of the anchors 111, such as in a direction along an X axis, and a second straight portion extending perpendicular to the first straight portion, such as in a direction along a Y axis. The area inside of the rectangular outer frame is equally divided into four regions by the cross.

Each of the beams 113 connects the anchor 111 and the movable electrode 112. The beam 113 has a rectangular frame shape in which two parallel bars are connected at ends thereof. The beam 113 serves as a spring that is displaceable in a direction, such as the direction along the X axis, perpendicular to a longitudinal direction of the two bars, such as in the direction along the Y axis. The movable electrode 112 is integrated with the anchors 111 through the beams 113. The movable electrode 112 is supported by the anchors 111 through the beams 113. In the embodiment shown in FIG. 1, the two beams 113 are formed at opposite ends of the movable electrode 112 to connect the anchors 111 and the movable electrode 112.

As shown in FIG. 2, the pattern portion 130 under the movable electrode 112 and the beams 113 are partly removed. Thus, the movable electrode 112 and the beams 113 are spaced from the support substrate 140 by a predetermined distance. That is, the movable electrode 112 and the beams 113 are supported in a floated condition on the support substrate 140.

As shown in FIG. 1, the fixed electrodes 114 are opposed to portions of the movable electrodes 112 to form capacitors with the movable electrodes 112. Two fixed electrodes 114 are arranged in each of the four divided areas of the movable electrode 112. The two fixed electrodes 114 extend in the direction along the Y axis in each area. Thus, the movable electrode 112 and the fixed electrodes 114 are parallel, relative to the direction along the Y axis. Further, the movable electrode 112 and the fixed electrodes 114 are opposed to each other. When the movable electrode 112 is displaced in a direction along the X axis due to an acceleration, a distance between the second straight portion of the movable electrode 112 extending in the direction along the Y axis and the fixed electrode 114 changes.

The sensor peripheral portion 150 is formed to entirely surround a periphery of the sensor structure 110, the connector portions 160 and the embedded portion 170. For example, the sensor peripheral portion 150 has a rectangular loop shape. The sensor structure 110, the connector portions 160 and the embedded portion 170 are located in the sensor peripheral portion 150. The sensor peripheral portion 150 is bonded to the cap 200.

The connector portions 160 are relay portions for electrically connecting the sensor structure 110 to external parts. The connector portions 160 are located in an area surrounded by the sensor peripheral portions 150. For example, three connector portions 160 are aligned in the direction along the X axis, as shown in FIG. 1. One of the three connector portions 160 is electrically connected to the anchor 111, that is, to the movable electrode 112. The other two connector portions 160 are electrically connected to the fixed electrodes 114, respectively.

The embedded portion 170 is a relay portion that electrically connects the second semiconductor substrate 142 of the support substrate 140 to an external part at a side of the cap 200. As shown in FIG. 3, a through hole 171 is formed to pass through the embedded portion 170, a portion of the pattern portion 130 located between the embedded portion 170 and the first insulating layer 144, and the first insulating layer 144. An embedded wire 172 is embedded in the through hole 171, and is electrically connected to the second semiconductor substrate 142.

The pattern portion 130 is configured to support the respective portions of the first semiconductor substrate 120 as described above. The metal layer 132 of the pattern portion 130 is patterned to include a wiring pattern 133 and a peripheral pattern 134.

The wiring pattern 133 includes wiring portions for electrically connecting the sensor structure 110 and the connector portions 160 and fixing portions for fixing the fixed electrodes 114 and the embedded portion 170 to the support substrate 140.

As shown in FIG. 1, one of the wiring portions of the wiring pattern 133 is arranged to connect the first anchor 111 (e.g., left anchor in FIG. 1) to one of the connector portions 160.

Further, another one of the wiring portions of the wiring pattern 133 is arranged to connect the fixed electrodes 114, which are located adjacent to the first anchor 111 in the respective areas divided by the movable electrode 112, and another one of the connector portions 160. Thus, the wiring portion connects the four fixed electrodes 114 and one connector portion 160 in a substantially Y-shape, for example.

Further, another one of the wiring portions of the wiring pattern 133 is arranged to connect the fixed electrodes 114, which are located adjacent to a second anchor 111 (e.g., right anchor in FIG. 1) in the respective areas divided by the movable electrode 112, and another one of the connector portions 160. Thus, the wiring portion connects the four fixed electrodes 114 and one connector portion 160 in a substantially U-shape.

The wiring pattern 133 is formed with contact portions 135. The wiring portions of the wiring pattern 133 are electrically connected to the respective portions of the first semiconductor substrate 120 through the contact portions 135.

The fixing portions of the wiring pattern 133 are arranged to also locate between the second anchor 111 and the support substrate 140 and between the embedded portion 170 and the support substrate 140. The wiring pattern 133 does not have the contact portions 135 at the fixing portions. The fixing portions of the wiring pattern 133 are arranged n a condition of being held between the insulating film 131 and the first insulating layer 144.

In the pattern portion 130 having the above-described wiring pattern 133, the insulating film 131 is partly removed, such as at locations between the beams 113 and the support substrate 140 and the movable electrode 112 and the support substrate 140, so that the beams 113 and the movable electrode 112 are movable relative to the support substrate 140. Accordingly, the movable electrode 112 is floated relative to the support substrate 140 and is movable relative to the fixed electrodes 114.

The peripheral pattern 134 is located between the support substrate 140 and the sensor peripheral portion 150, and has a shape that entirely surrounds the periphery of the sensor structures 110 and the like. Further, the peripheral pattern 134 is a pattern to hermetically seal the sensor structures 110 and the like. As shown in FIG. 2, the peripheral pattern 134 is disposed along the insulating film 131. Further, as shown in FIG. 1, the peripheral pattern 134 has a double loop shape so as to improve hermetic sealing. In other words, the peripheral pattern 134 is divided into two parts. Therefore, when the peripheral pattern 134 is disposed between the insulating film 131 and the first insulating layer 144, a stress applied to each of the parts can be alleviated.

Further, as shown in FIG. 3, the peripheral pattern 134 is electrically connected to the sensor peripheral portion 150 through the contact portion 135. It can be said that the contact portions 135 are part of the wiring pattern 133 and the peripheral pattern 134.

The first semiconductor substrate 120 and the support substrate 140 are joined to each other by directly bonding the wiring pattern 133 and the peripheral pattern 134 to the surface 141 of the support substrate 140.

The cap 200 serves to restrict entry of water, foreign materials and the like to the sensor structure 110 of the sensor unit 100. As shown in FIGS. 1 through 3, the cap 200 includes a silicon substrate 210, electrically insulating films 220, 230 and first to fourth penetrating electrodes 300, 310, 320, 330.

The insulating film 220 is disposed along a surface of the silicon substrate 210, which faces the sensor unit 100. The insulating film 220 is, for example, made of $SiO_2$. The surface of the insulating film 220 provides the first surface 201 of the cap 200. The insulating film 230 is disposed along an opposite surface of the silicon substrate 210. The insulating film 230 is, for example, made of $SiO_2$. The surface of the insulating film 230 provides the second surface 202 of the cap 200.

The cap 200 has a recess 202 at a position opposing to the area in which the sensor structure 110 is formed. The recess 203 is formed so as to restrict the cap 200 from contacting the sensor structure 110 when the cap 200 is joined to the sensor unit 100.

The first surface 201 of the cap 200 is bonded to the surface 101 of the sensor unit 100. Specifically, the first surface 201 of the cap 200 is bonded to the sensor peripheral portion 150, the connector portions 160 and the embedded portion 170 so that the sensor structure 110 is hermetically sealed. As such, as shown in FIG. 2, a sealed chamber 240 hermetically sealed between the sensor unit 100 and the cap 200 is formed, and the sensor structure 110 is disposed in the sealed chamber 240. For example, the sealed chamber 240 is sealed in a vacuum condition or in a predetermined pressure. Alternatively, the sealed chamber 240 can be sealed with $N_2$, $H_2$, He or the like.

As shown in FIG. 2, the cap 200 is formed with a hole 301 passing through the insulating film 230, the silicon substrate 210, the insulating film 220. The hole 301 passes through the cap 200 in a layering direction in which the first semiconductor substrate 120 and the support substrate 140 are layered, such as in an up and down direction in FIG. 2. An electrically insulating film 302 is formed along a wall forming the hole 301.

The first penetrating electrode 300 is disposed on the insulating film 302. An end of the first penetrating electrode 300 is electrically connected to the connector portion 160. An opposite end of the first penetrating electrode 300 is patterned to have a pad shape on the second surface 202 of the cap 200. As such, the first penetrating electrode 300, the connector portion 160 and the wiring pattern 133 allow an electrical connection between the fixed electrodes 114 of the sensor structure 110 and an external part.

Further, as shown in FIG. 3, the cap 200 is formed with a hole 311. The hole 311 passes through the insulating film 230, the silicon substrate 210 and the insulating film 220. Similar to the hole 301, the hole 311 passes through the cap 200 in the layering direction. The hole 311 is in communication with the through hole 171 of the embedded portion 170. An insulating film 312 is formed along a wall forming the hole 311.

The second penetrating electrode 310 is disposed on the insulating film 312. An end of the second penetrating electrode 310 is electrically connected to the embedded wire 172. An opposite end of the second penetrating electrode 310 is patterned to have a pad shape on the second surface 202 of the cap 200. As such, the second semiconductor substrate 142 of the support substrate 140 can be fixed at a predetermined potential through the second penetrating electrode 310 and the embedded wire 172, and the sensor structure 110 can be electrically shielded.

Furthermore, the cap 200 is formed with a hole 321. The hole 321 passes through the cap 200 in the layering direction. An insulating film 322 is formed along a wall forming the hole 321. A third penetrating electrode 320 is disposed on the insulating film 322. An end of the third penetrating electrode 320 is electrically connected to the sensor peripheral portion 150. An opposite end of the third penetrating electrode 320 is patterned to have a pad shape on the second surface 202 of the cap 200. As such, the sensor peripheral portion 150 can be fixed at a predetermined potential through the third penetrating electrode 320, and the sensor structure 110 can be electrically shielded.

The cap 200 is formed with further another hole (not shown) passing through the insulating film 230 and reaching the silicon substrate 210. An insulating film is formed along a wall forming the hole, and the fourth penetrating electrode 330 is disposed on the insulating film. An end of the fourth penetrating electrode 330 is electrically connected to the silicon substrate 210. It is to be noted that the fourth penetrating electrode 330 is an electrode formed in a hole of the insulating film 230, as shown in FIG. 1. Such an electrode is referred to as a penetrating electrode, for the sake of convenience. An opposite end of the fourth penetrating electrode 330 is patterned to have a pad shape on the second surface 202 of the cap 200. As such, the silicon substrate 210 can be fixed at a predetermined potential through the fourth penetrating electrode 330, the sensor structure 110 can be electrically shielded.

With the above structure, a first capacitor and a second capacitor are provided by the opposed fixed electrodes 114 and movable electrode 112. The first capacitor and the second capacitor are connected in series. A change in capacitance of each capacitor can be outputted. Here, a capacitance of the first capacitor is referred to as CS1 and a capacitance of the second capacitor is referred to as CS2. The change in capacitance of each of the first and second capacitors (CS1-CS2) is outputted to a switched capacitor circuit provided outside of the semiconductor physical quantity sensor.

The switched capacitor circuit coverts the output of the first and second capacitors, that is, the change in capacitance, into a voltage. Although not illustrated, the switched capacitor circuit is constructed of an operational amplifier, a capacitor having a capacity of Cf and a switch. The movable electrode 112, which is common to the first and second capacitors, is connected to an inversion input terminal of the operational amplifier. The capacitor having the capacity of Cf and the switch are connected in parallel between the inversion input terminal and an output terminal of the operation amplifier.

A square wave voltage Vcc having a phase difference of 180 degrees is periodically impressed to the fixed electrode 114 of each of the first and second capacitors, and a reference voltage (Vcc/2) is impressed into a non-inverting input terminal of the switched capacitor circuit. The switch is connected and disconnected at predetermined timing. When an acceleration acts on the movable electrode 112, the change in capacitance (CS1-CS2) in accordance with the displacement of the movable electrode 112 is inputted to the switched capacitor circuit. Thus, a signal corresponding to (CS–CS2)·Vcc/Cf is outputted from the switched capacitor circuit. The output signal is used as acceleration data in other circuits.

The semiconductor physical quantity sensor according to the present embodiment generally has the above-described structure. Materials of the respective parts of the semiconductor physical quantity sensor will be explained in detail in the following description regarding a manufacturing process.

A method of manufacturing the semiconductor physical quantity sensor illustrated in FIGS. 1 to 3 will be described with reference to FIGS. 4A through 10B. FIGS. 4A through 8 are cross-sectional views each taken along a line corresponding to the line II-II of FIG. 1. FIGS. 9A through 10B are cross-sectional views each taken along a line corresponding to the line III-III in FIG. 1. Hereinafter, a manufacturing process will be described while comparing steps shown in FIGS. 4A through 8 with steps shown in FIGS. 9A to 10B.

The semiconductor physical quantity sensor is manufactured in a state of a wafer, and is obtained by dividing the wafer into chips. Therefore, the steps described hereinafter are conducted in the state of a wafer. That is, the first semiconductor substrate 120 and the like, which are described hereinabove, are part of the wafer.

Referring to FIG. 4A, first, the first semiconductor substrate 120 is prepared. For example, the first semiconductor substrate 120 is a single-crystal silicon substrate having an $n^+$-type (0001) face containing an impurity of As, P, Sb or the like at a high concentration and having a specific resistance of 0.0001 $\Omega$·cm to 0.1 $\Omega$·cm.

As the insulating film 131, a phospho-silicate-glass (PSG) film having a thickness of 0.5 μm to 2 μm is formed on the surface 121 of the first semiconductor substrate 120. Contact holes 136 are formed in the insulating film 131 at positions corresponding to the anchors 111, the fixed electrodes 114, the connector portions 160, the embedded portion 170 and the sensor peripheral portion 150 by a photolithography and etching technique.

Next, as the metal layer 132, an aluminum (Al) film having a thickness of 0.1 μm to 2 μm is formed on the insulating film 131. Further, the aluminum film is patterned to form the pattern portion 130 including the wiring pattern 133 and the peripheral pattern 134 on the insulating film 131. Portions of the metal layer 132 filled in the contact holes 136 form the contact portions 135.

The peripheral pattern 134 is formed on the surface 121 of the first semiconductor substrate 120 to have the shape that entirely surrounds the area to which the sensor structure 110 is to be formed, such as a loop shape. In the step, for example, the peripheral pattern 134 is formed into a double loop shape so as to improve the hermetical sealing and to alleviate a stress applied thereto. There is not special limitation to the shape of the peripheral pattern 134. For example, the peripheral pattern 134 may be formed into a triple loop shape. Depending on a use condition of the semiconductor physical quantity sensor, the peripheral patter 134 may be a single loop shape.

The metal layer 132 is exemplarily made of the Al film. Alternatively, the metal layer 132 may be made of Cu, Au, W, Al—Si, or similar metal film, an $n^+$-type polycrystalline silicon film containing an impurity at a high concentration, or an alloy film.

In a step shown in FIG. 4B, the second semiconductor substrate 142 is prepared. The second semiconductor substrate 142 is provided by a similar substrate to the first semiconductor substrate 120. As the first insulating layer 144, a $SiO_2$ film having a thickness of 0.3 μm to 2 μm is formed by forming an oxidizing film at least on a surface 143 of the second semiconductor substrate 142.

In a step shown in FIG. 5A, the first semiconductor substrate 120 and the support substrate 140 are joined to each other by directly bonding the pattern portion 130 and the surface 141 of the support substrate 140.

For example, the first semiconductor substrate 120 and the support substrate 140 are joined by a room-temperature direct bonding technique at a room temperature to 450 degrees Celsius. In the room-temperature direct bonding technique, the surface of the Al film forming the wiring pattern 133 and the peripheral pattern 134 and the surface of the $SiO_2$ film as the first insulating film 144 on the second semiconductor substrate 142 are respectively activated, such as in an Ar-ion or Ar plasma environment, and then the activated surfaces are directly bonded to each other. In this case, the wiring pattern 133 and the peripheral pattern 134 are securely bonded to the first insulating layer 144.

Alternatively, the first semiconductor substrate 120 and the support substrate 140 may be joined to each other in a condition where a metal, such as aluminum, similar to the wiring pattern 133 and the peripheral pattern 134, or a polycrystalline silicon is formed on the first insulating layer 144. As another example, the first semiconductor substrate 120 and the support substrate 140 may be joined to each other through an eutectic alloy. In this case, for example, an aluminum film is formed on one of the wiring and peripheral patterns 133, 134 and the first insulating layer 144 and a Ge film is formed on the other one of the wiring and peripheral patterns 133, 134 and the first insulating layer 144. Furthermore, the wiring pattern 133 and the peripheral pattern 134 may be bonded to the first insulating layer 144 by a bonding agent or an eutectic alloy.

Figure 9A:
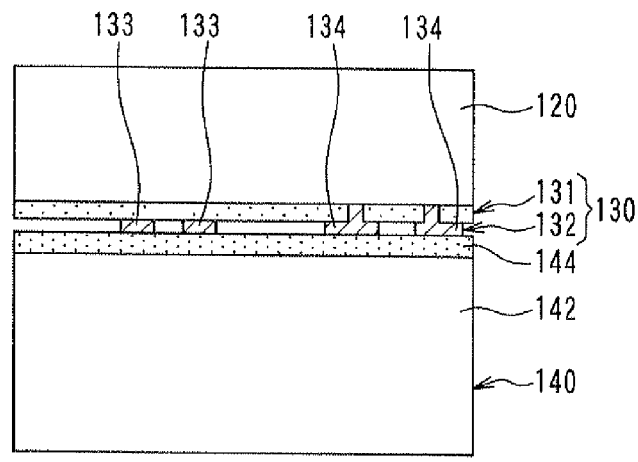
FIGS. 9A, 9B, 9C, 10A and 10B are cross-sectional views showing a process of manufacturing a part of the semiconductor physical quantity sensor shown in FIG. 3.

By the step shown in FIG. 5A, the peripheral pattern 134 is directly bonded to the first insulating layer 144, as shown in FIG. 9A. A portion of the wiring pattern 133 to which the through hole 171 is to be formed is removed beforehand.

After the first semiconductor substrate 120 and the support substrate 140 are joined to each other in the above-described manner, the first semiconductor substrate 120 is thinned to have a thickness of 5 μm to 50 μm, such as by grinding, polishing, or etching.

Figure 9B:
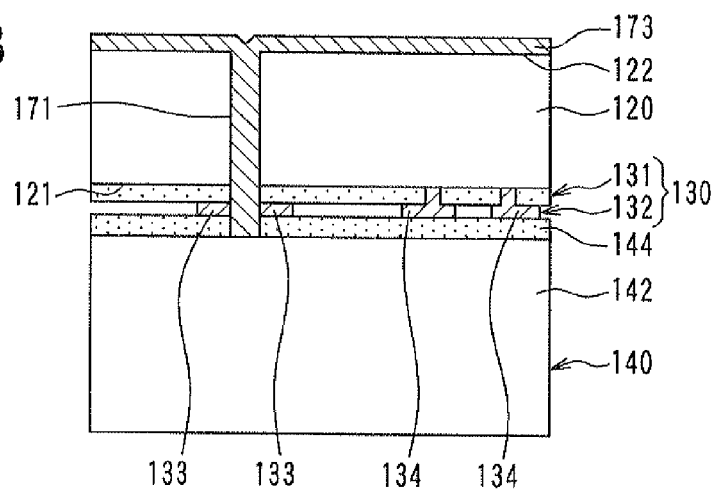
Figure 9C:
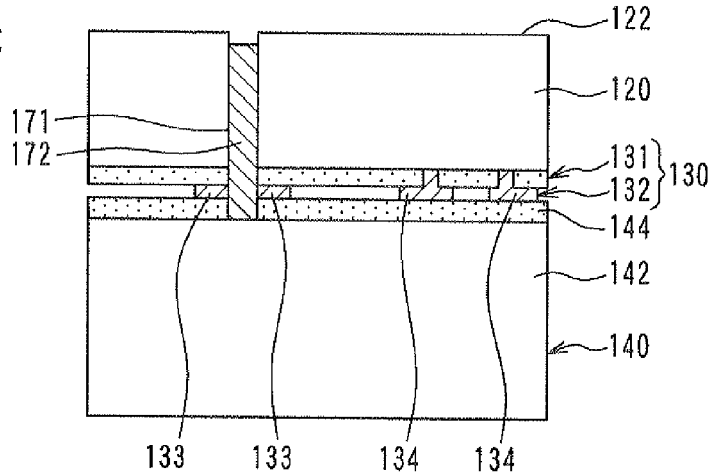

In a step shown in FIG. 9B, the through hole 171 is formed in the portion of the first semiconductor substrate 120 to which the embedded portion 170 is to be formed. The through hole 171 is formed to pass through the first semiconductor substrate 120, the pattern portion 130 (the insulating film 131) and the first insulating layer 144.

Further, as a metal layer 173, a polycrystalline silicon film containing an impurity at a high concentration or an aluminum film is filled in the through hole 171 to be electrically connected to the second semiconductor substrate 142. In this case, the metal layer 173 is formed also above a surface 122 of the first semiconductor substrate 120, which is opposite to the surface 121.

In a step shown in FIG. 9O, the metal layer 173 on the surface 122 of the first semiconductor substrate 120 is removed. In this case, the metal layer 173 is removed by an etch-back technique so that the remaining metal layer 173 does not project from the surface 122 of the first semiconductor substrate 120. In other words, the metal layer 173 is removed so that a recess is formed on the surface 122 of the first semiconductor substrate 120. Such a recess is formed in order to securely connect a part of the cap 200 to the embedded portion 170 when the cap 200 is joined to the first semiconductor substrate 120. In this way, the embedded wire 172 is formed by etching the metal layer 173.

Next, in a step shown in FIG. 5B, the sensor structure 110, which is to be electrically connected to the wiring pattern 133, is formed in the first semiconductor substrate 120. In this case, trench grooves 123 are formed in the first semiconductor substrate 120. The trench grooves 123 are perpendicular to the surface 121 of the first semiconductor substrate 120, and reach the insulating film 131 of the pattern portion 130.

Thus, the sensor structure 110, the sensor peripheral portion 150, the connector portions 160 and the embedded portion 170 are formed. The sensor peripheral portion 150 is formed to entirely surround the periphery of the sensor structure 110. The sensor peripheral portion 150 is connected to the portion of the pattern portion 130 corresponding to the peripheral pattern 134. The connector portions 160 are electrically connected to the wiring pattern 133 and are located in the area surrounded by the sensor peripheral portion 150.

Figure 10A:
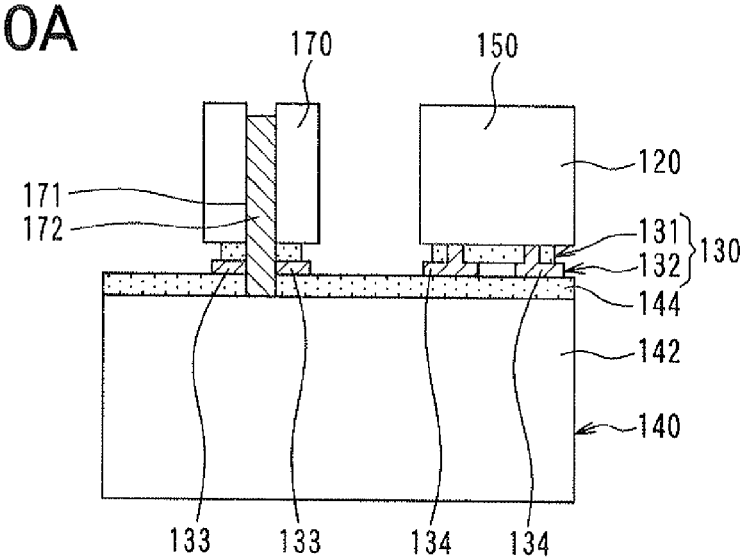

In this way, the first semiconductor substrate 120 is divided into the sensor structure 110, the sensor peripheral portion 150, the connector portions 160 and the embedded portion 170. Further, the embedded portion 170 is formed so that the embedded wire 172 is located in the embedded portion 170, as shown in FIG. 10A.

In a step shown in FIG. 6, at least a portion of the insulating film 131 that is located under the movable electrode 112 and the beams 113 is removed, such as by an etching technique in hydrogen fluoride (HF) vapor. Thus, the movable electrode 112 and the beams 113 are spaced from the support substrate 140 by a predetermined distance and become in condition of floating above the support substrate 140. That is, the movable electrode 112 becomes in a condition of being movable relative to the support substrate 140.

In this case, although the portion of the insulating film 131 between the wiring pattern 133 and the fixed electrodes 114 is removed, the fixed electrodes 114 are supported by the wiring pattern 133 by means of the contact portions 135. The insulating film 131 between the anchors 111 and the wiring pattern 133 and between the connector portions 160 and the wiring pattern 133 are not completely removed, but partly remain. Further, the insulating film 131 remains between the sensor peripheral portion 150 and the peripheral pattern 134 so as to hermetically seal the sensor structure 110. In this way, the sensor unit 100 is formed.

Figure 7:
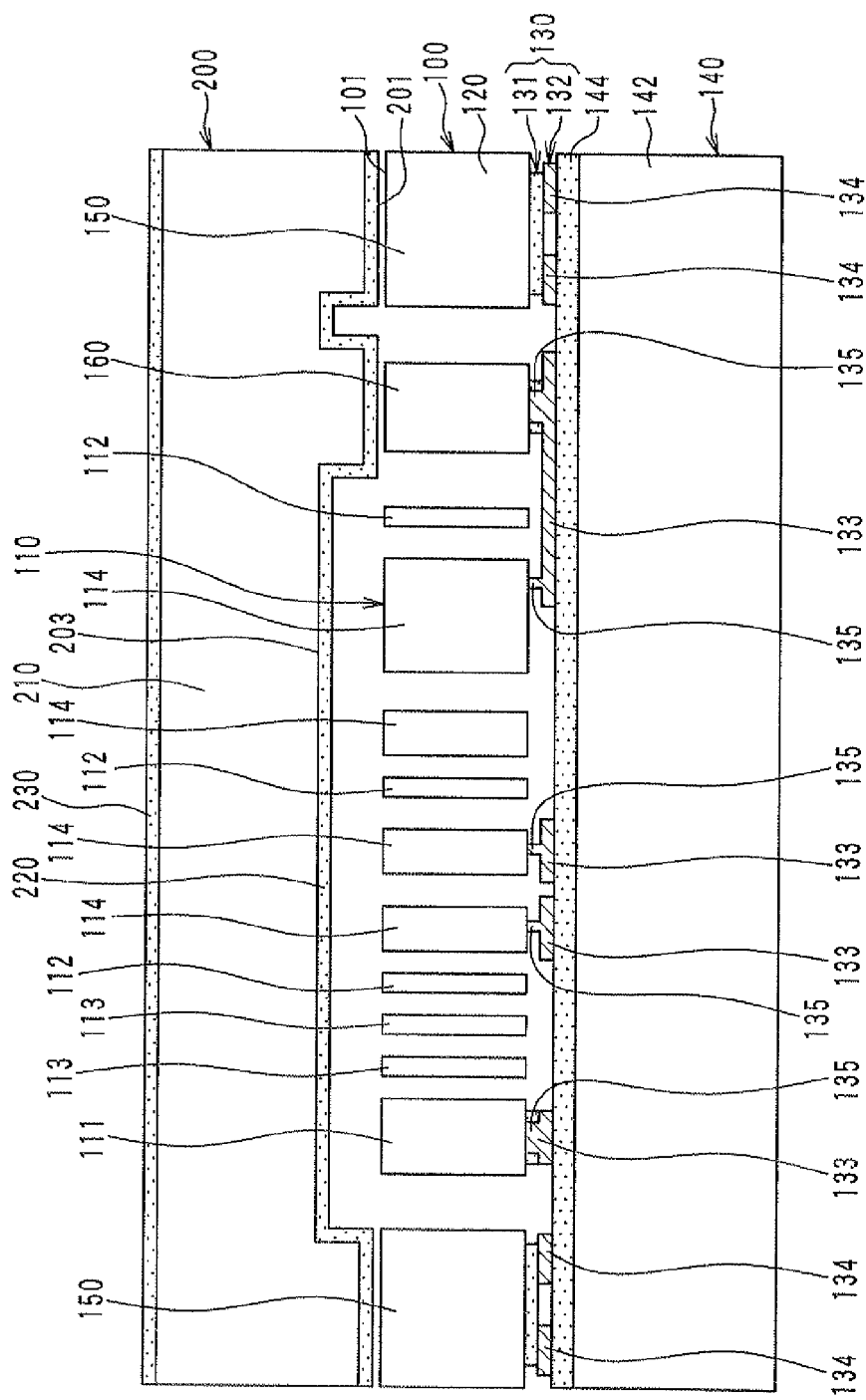

Next, in a step shown in FIG. 7, the cap 200 is bonded to the sensor unit 100 to hermetically seal the sensor structure 110. For example, the silicon substrate 210 is prepared. The recess 203 is formed on the surface of the silicon substrate 210, which is to be faced to the sensor structure 100, at an area without corresponding to the sensor peripheral portion 150, the connector portions 160 and the embedded portion 170. Further, the insulating film 220 is formed along the surface of the silicon substrate 210. Moreover, the insulating film 230 is formed along the surface of the silicon substrate 210, which is opposite to the surface on which the insulating film 220 is formed. For example, the insulating films 220, 230 are made of $SiO_2$. It is to be noted that the cap 200 is also formed in a state of a wafer.

Thereafter, similar to the step shown in FIG. 5A, the surface 101 of the sensor unit 100, that is, the surface 122 of the first semiconductor substrate 120, and the surface 201 of the cap 200, that is the surface of the insulating film 220, are respectively activated and bonded to each other by the room temperature bonding technique.

Thus, the sensor peripheral portion 150, the connector portions 160 and the embedded portion 170 are bonded to the cap 200, so the sensor structure 110 is hermetically sealed in the sealed chamber 240 formed by the cap 200, the sensor peripheral portion 150, the peripheral pattern 134 of the pattern portion 130 and the support substrate 140. In this case, the condition of the sealed chamber 240 can be created by bonding the sensor unit 100 and the cap 200 such as in a vacuum condition, in a predetermined pressurized condition, or in a predetermined environment (e.g., $N_2$, $H_2$, He or the like).

Alternatively, the sensor unit 100 and the cap 200 may be bonded to each other using a bonding material or bonded by a low-melting point glass bonding technique. As another example, the sensor unit 100 and the cap 200 can be bonded to each other by an eutectic bonding of Al and Ge. In this case, for example, an aluminum pattern is formed on the surface 101 of the sensor unit 100, and a Ge pattern is formed on the surface 201 of the cap 200. Alternatively, the eutectic alloy may be Al—Si, or the like.

Figure 10B:
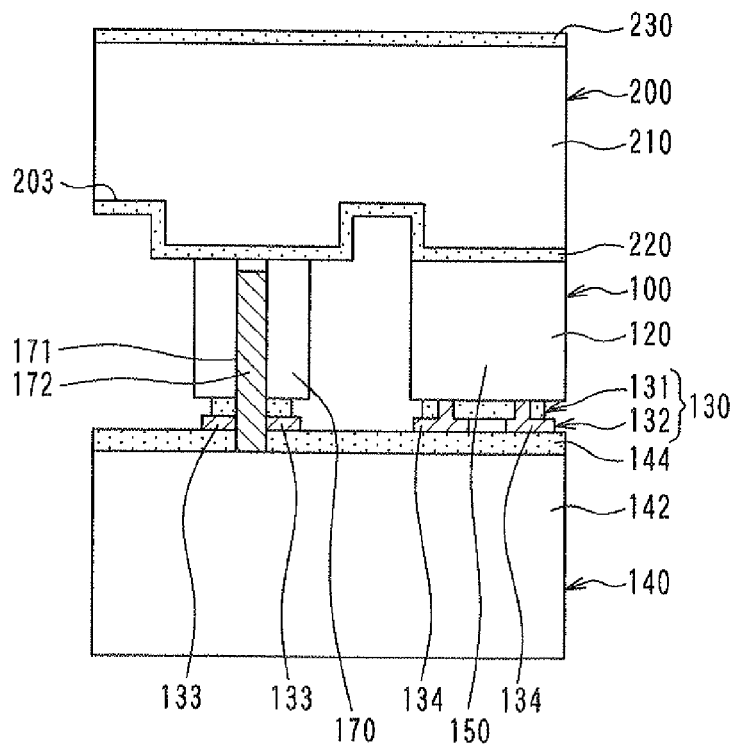

When the cap 200 is bonded to the sensor unit 100, as shown in FIG. 10B, the cap 200 is bonded to the embedded portion 170 to cover the through hole 171.

Figure 8:
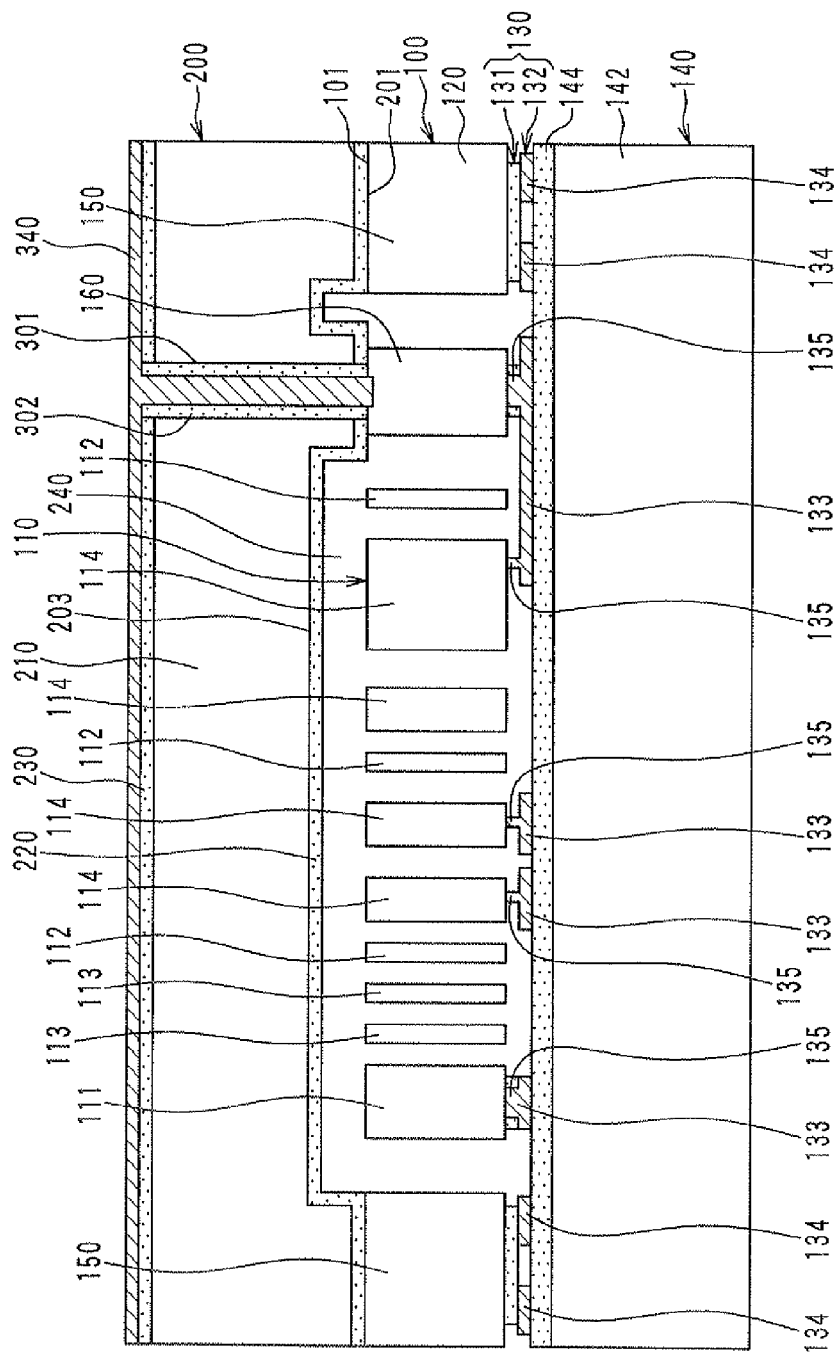

In a step shown in FIG. 8, the first to fourth penetrating electrodes 300, 310, 320, 330 are formed in the cap 200. For example, the holes 301, 311, 321 are formed in the cap 200 by a dry etching technique to pass through the insulating film 230, the silicon substrate 210 and the insulating film 220. In this case, first, the insulating film 230 is dry-etched in a perpendicular direction. Next, the silicon substrate 210 is dry-etched in a perpendicular direction. Then, the insulating film 220 is dry-etched in a perpendicular direction. Also, the hole for the fourth penetrating electrode 330 is formed to pass through the insulating film 230 and to reach the silicon substrate 210.

Then, the insulating films 302, 312, 322, such as $SiO_2$ films, are formed on the walls forming the holes 301, 311, 321 by a chemical vapor deposition (CVD) technique, a plasma oxide CVD technique or the like. Further, the portions of the insulating films 302, 312, 322 at the bottoms of the holes 301, 311, 321 are removed by an anisotropic etching technique so that the sensor peripheral portion 150, the connector portions 160 and the embedded wire 172 of the embedded portion 170 are exposed. The insulating film is also formed on the wall forming the hole for the fourth penetrating electrode 330, and the portion of the insulating film at the bottom of the hole is removed so that the silicon substrate 210 is exposed.

Next, a metal layer 340, such as aluminum layer, is embedded in the holes 301, 311, 321 by a CVD technique or the like. Thus, the metal layer 340 is electrically connected to the sensor peripheral portion 150, the connector portions 160 and the embedded wire 172 of the embedded portion 170. In this case, the metal layer 340 remains above the insulating film 230. The remaining metal layer 340 is patterned into the pads by a photolithography and etching technique.

As such, the first to third electrodes 300, 310, 320 passing through the cap 200 in the layering direction of the first semiconductor substrate 120 and the support substrate 140 are formed. The first penetrating electrodes 300 are electrically connected to the connector portions 160. The second penetrating electrode 310 is electrically connected to the embedded wire 172. The third penetrating electrode 320 is electrically connected to the sensor peripheral portion 150.

Further, the metal layer 340 is embedded in the hole for the fourth penetrating electrode 330 to be electrically connected to the silicon substrate 210. The fourth penetrating electrode 330 is formed by patterning the metal layer 340 remaining above the insulating film 230 into the pad. Thus, the fourth penetrating electrode 330 is electrically connected to the silicon substrate 210 of the cap 200.

As described above, the semiconductor physical quantity sensor is formed in the sate of a wafer. The wafer is divided into chips, that is, divided into every physical quantity sensor. Accordingly, the semiconductor physical quantity sensor shown in FIGS. 1 through 3 is finished. Further, wires (not shown) are connected to the pads of the first to fourth penetrating electrodes, 300, 310, 320, 330, so the semiconductor physical quantity sensor is electrically connected to external parts and is operable.

As described above, in the present embodiment, the first semiconductor substrate 120 having the pattern portion 130 including the wiring pattern 133 and the peripheral pattern 134 is prepared, and the support substrate 140 having the insulating layer 144 on the second semiconductor substrate 142 is prepared. Then, the first semiconductor substrate 120 and the support substrate 140 are joined to each other by bonding the wiring pattern 133 and the peripheral pattern 134 to the first insulating layer 144 by the directly bonding or the like.

That is, the wiring pattern 133 and the peripheral pattern 134, which are previously formed on the surface 121 of the first semiconductor substrate 120, are bonded to the support substrate 140. Therefore, it is not necessary to form a thin film on the first semiconductor substrate 120 and to flatten the thin film for enhancing the bonding of the first substrate 120 to the support substrate 140. Accordingly, the manufacturing process is shortened, and a simplified layer structure can be easily formed.

In such a case, the forming of the thin film on the first semiconductor substrate 120 and the flattening of the thin film for enhancing the bonding between the first semiconductor substrate 120 and the support substrate 140 are not performed. Therefore, there is no problem arises such as accuracy of flattening of the thin film, and thus a characteristic of the sensor structure 110 will not be affected. Accordingly, the semiconductor physical quantity sensor, which is stably manufactured and has a stable characteristic, can be obtained.

Further, in the present embodiment, the sealed chamber 240 is formed by bonding the cap 200 to the sensor unit 100, and the sensor structure 110 is sealed in the sealed chamber 240. Therefore, it is less likely that foreign materials, water and the like will enter the sensor structure 110. The sensor structure 110 can be protected.

Further, the first to fourth penetrating electrode 300, 310, 320, 330 are formed in the cap 200. Therefore, the sensor structure 110 can be electrically connected to external parts on the side of the cap 200. Moreover, the cap 200, the sensor peripheral portion 150, the second semiconductor substrate 142 can be fixed at predetermined potentials. Therefore, the sensor structure 110 can be electrically shielded.

Second Embodiment

Figure 11:
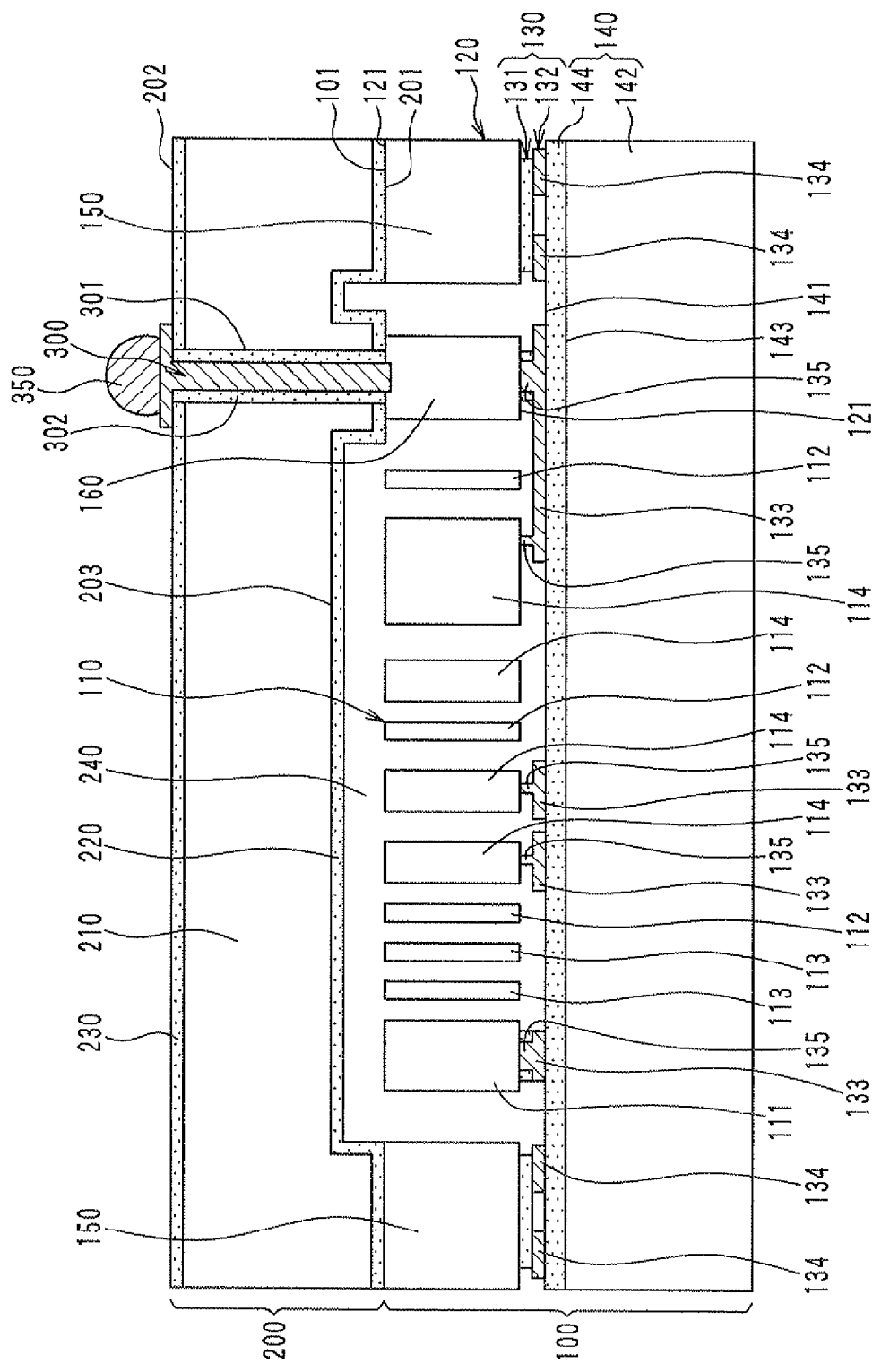
FIG. 11 is a cross-sectional view of a semiconductor physical quantity sensor according to a second embodiment of the present invention.

A second embodiment will be described hereinafter with reference to FIG. 11. A structure different from the first embodiment will be mainly described. FIG. 11 is a cross-sectional view of a semiconductor physical quantity sensor according to the present embodiment, taken along a line corresponding to the II-II line in FIG. 1.

As shown in FIG. 11, the semiconductor physical quantity sensor has bonding balls 350 on the pads of the first penetrating electrodes 300, in addition to the structure of the first embodiment. The semiconductor physical quantity sensor further has the bonding balls 350 on the pads of the second and third penetrating electrodes 310, 320.

The bonding balls 350 are made of Au, solder, or the like. In this case, the semiconductor physical quantity sensor can be bonded to a circuit board by a ball-bonding technique.

Third Embodiment

A third embodiment will be described hereinafter with reference to FIGS. 12 through 14B. A structure different from the first and second embodiments will be mainly described. In the above-described embodiments, the first to fourth penetrating electrodes 300, 310, 320, 330 are disposed in the cap 200. In the present embodiment, on the other hand, the first penetrating electrodes 300, the second penetrating electrode 310 and the third penetrating electrode 320 are disposed in the support substrate 140.

Figure 12:
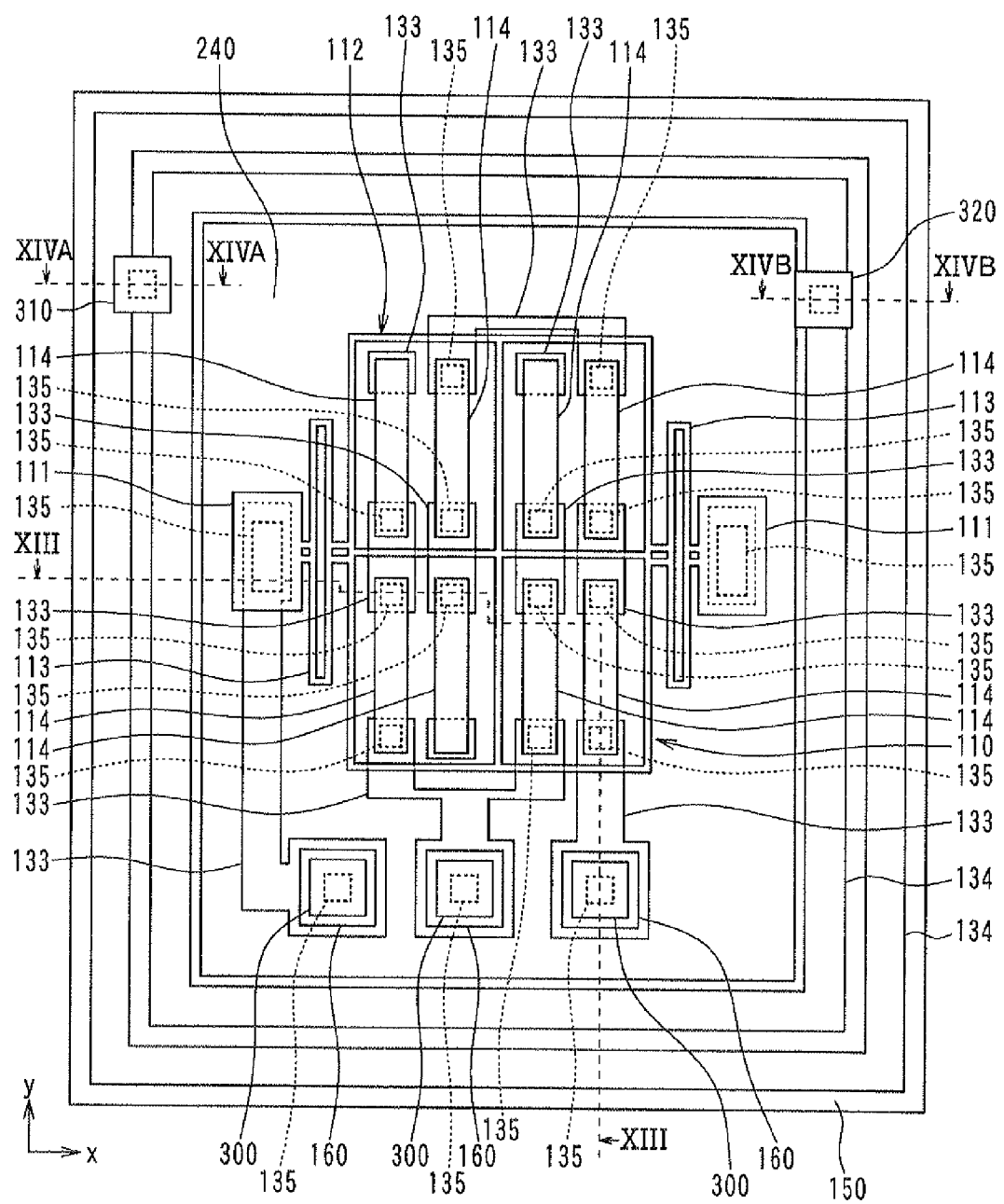
FIG. 12 is a plan view of a semiconductor physical quantity sensor according to a third embodiment of the present invention.
Figure 13:
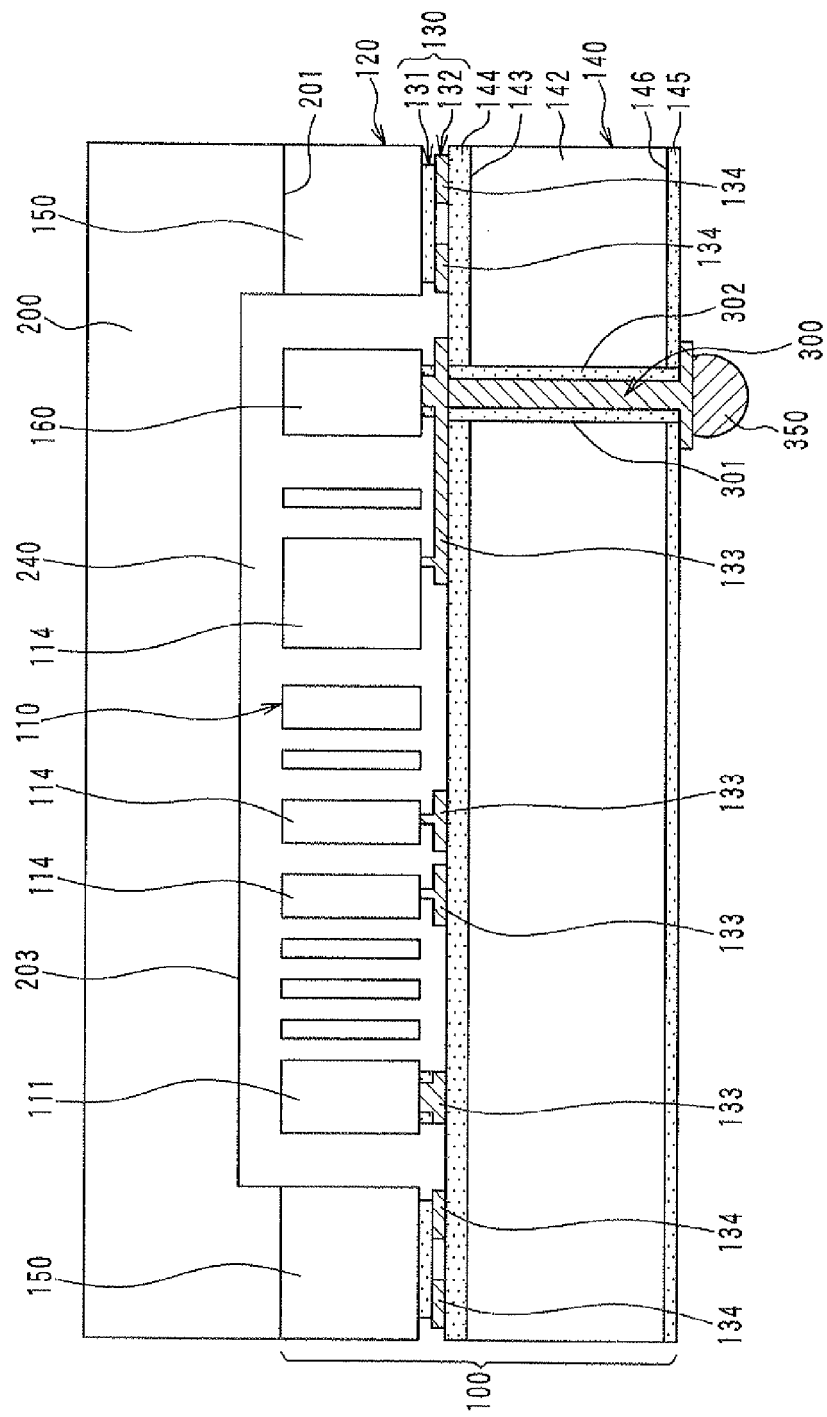
FIG. 13 is a cross-sectional view taken along a line XIII-XIII in FIG. 12.
Figure 14A:
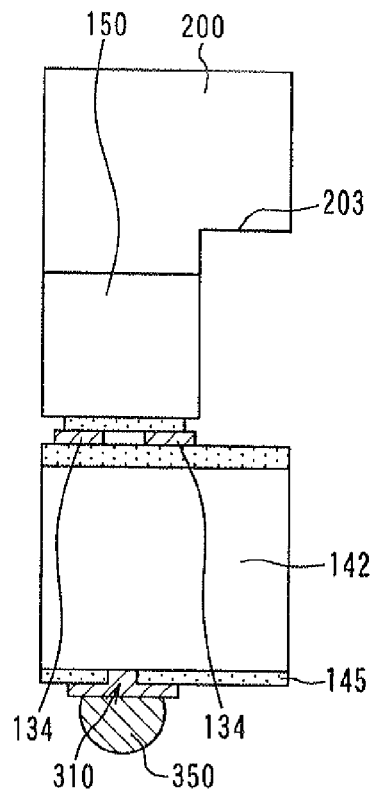
FIG. 14A is a cross-sectional view taken along a line XIVA-XIVA in FIG. 12.
Figure 14B:
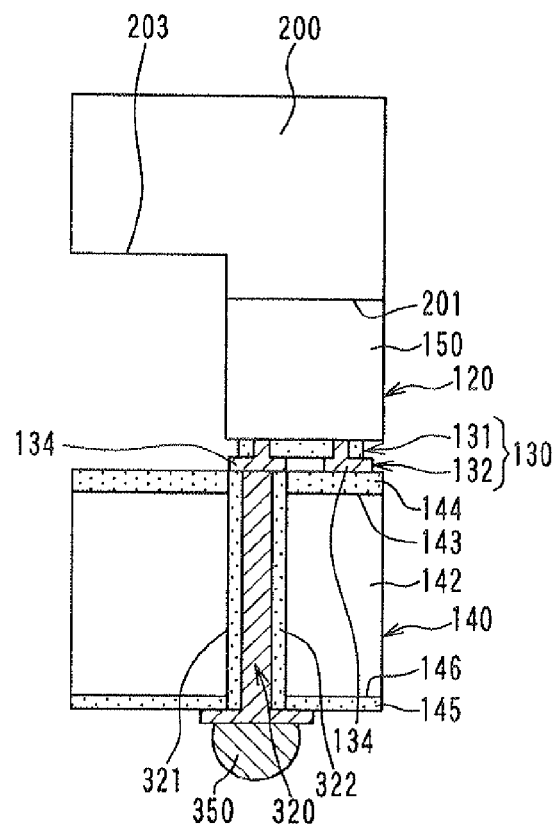
FIG. 14B is a cross-sectional view taken along a line XIVB-XIVB in FIG. 12.

FIG. 12 is a plan view of a semiconductor physical quantity sensor according to the present embodiment. FIG. 13 is a cross-sectional view taken along a line XIII-XIII in FIG. 12. FIG. 14A is a cross-sectional view taken along a line XIVA-XIVA in FIG. 12. FIG. 14B is a cross-sectional view taken along a line XIVB-XIVB in FIG. 12. FIG. 12 is a plan view in which the cap 200 and some parts are illustrated as transparent to show underneath structures for explanatory purposes.

In the present embodiment, the support substrate 140 is constructed of the second semiconductor substrate 142, the first electrically insulating layer 144 and a second electrically insulating layer 145, as shown in FIGS. 13 and 14. The support substrate 140 has a layer structure in which the first insulating layer 144 is formed on the surface 143 of the second semiconductor substrate 142 and the second insulating layer 145 is formed on an opposite surface 146 of the second semiconductor substrate 142.

The cap 200 is, for example, a single-crystalline silicon substrate. The cap 200 is bonded to the sensor peripheral portion 150. In the present embodiment, the recess 203 is formed in an area other than the area bonded to the sensor peripheral portion 150 in the surface 201 of the cap 200.

Further, as shown in FIG. 13, the first penetrating electrode 300 is disposed in the support substrate 140. The first penetrating electrode 300 passes through the support substrate 140 in the layering direction of the first semiconductor substrate 120 and the support substrate 140. Further, the first penetrating electrode 300 is electrically connected to the wiring pattern 133.

The first penetrating electrode 300 of the present embodiment has the similar constitution and structure as the first penetrating electrode 300 of the first embodiment. In the present embodiment, however, the second insulating layer 145 is formed on the surface 146 of the second semiconductor substrate 142. Therefore, the hole 301 is formed to reach the wiring pattern 133 while passing through the second insulating layer 145, the second semiconductor substrate 142 and the first insulating layer 144. The insulating film 302 is formed on the wall of the hole 301, and the first penetrating electrode 300 is disposed on the insulating film 302. Further, the end of the first penetrating electrode 300 is electrically connected to the connector portion 160.

As shown in FIG. 14A, the second penetrating electrode 310 is disposed on an insulating film, which is formed on a wall of a hole passing through the second insulating layer 145. Thus, the second penetrating electrode 310 is electrically connected to the second semiconductor substrate 142. Further, because the second penetrating electrode 310 is directly electrically connected to the second semiconductor substrate 142, the sensor unit 100 needs not to have the embedded portion 170. In the present embodiment, the second penetrating electrode 310 and the third penetrating electrode 320 are disposed at opposite locations with respect to the direction along the X axis.

As shown in FIG. 14B, the hole 321 for the third penetrating electrode 320 is formed to reach the peripheral pattern 134 while passing through the second insulating layer 145, the second semiconductor substrate 142 and the first insulating layer 144. The peripheral pattern 134 is electrically connected to the sensor peripheral portion 150 and the cap 200 through the contact portion 135. Further, the insulating film 322 is formed on the wall of the hole 321, and the third penetrating electrode 320 is disposed on the insulating film 322. The end of the third penetrating electrode 320 is electrically connected to the peripheral pattern 134.

In the present embodiment, the third penetrating electrode 320 is electrically connected to both the sensor peripheral portion 150 and the cap 200. Therefore, the fourth penetrating electrode 330 for allowing an electrical connection between the cap 200 and an external part is not necessary.

The bonding balls 350 are formed on the pads of the first to third penetrating electrodes 300, 310, 320, as shown in FIGS. 13, 14A, and 14B. Alternatively, bonding wires can be bonded to the pads of the first to third penetrating electrodes 300, 310, 320.

The first to third penetrating electrodes 300, 310, 320 are formed in the support substrate 140 after the sensor structure 110 is hermetically sealed by bonding the sensor unit 100 and the cap 200 to each other. For example, the first to third penetrating electrodes 300, 310, 320 are formed after the step shown in FIG. 7. Further, in manufacturing the semiconductor physical quantity sensor, the support substrate 140 in which the first insulating layer 144 and the second insulating layer 145 are formed on the surface 143 and the opposite surface 146 of the second semiconductor substrate 142, respectively, is used.

As described above, the sensor structure 110 is electrically connected to the external parts on the side of the support substrate 140 by arranging the first to third penetrating electrodes 300, 310, 320 in the support substrate 140. Also, the sensor structure 110 is electrically shielded.

Fourth Embodiment

Figure 15:
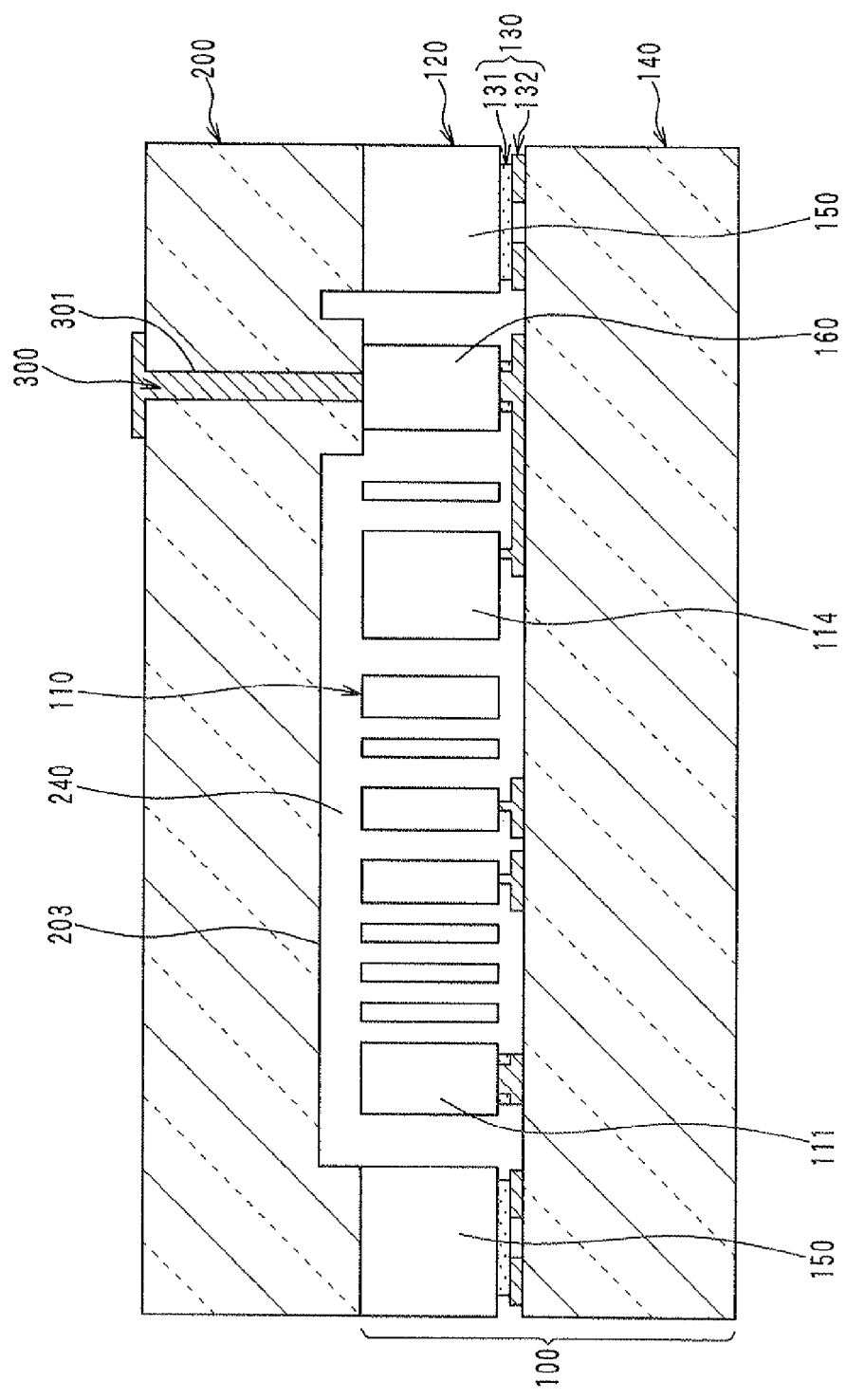
FIG. 15 is a cross-sectional view of a semiconductor physical quantity sensor according to a fourth embodiment of the present invention.

A fourth embodiment will be described hereinafter with reference to FIG. 15. A structure different from the first embodiment will be mainly described. FIG. 15 is a cross-sectional view of a semiconductor physical quantity sensor according to the present embodiment, taken along a line corresponding to the II-II line in FIG. 1. As shown in FIG. 15, one of or both of the support substrate 140 and the cap 200 are made of an electrically insulating substrate such as ceramic substrate or glass substrate having a coefficient of thermal expansion similar to that of a single-crystalline silicon substrate.

Because glass has the coefficient of thermal expansion similar to that of the single crystalline silicon substrate, a stress due to a difference in coefficient of thermal expansion will not be applied to the first semiconductor substrate 120 forming the sensor structure 110 and the like. Further, parasitic capacitances between the first semiconductor substrate 120 and the cap 200 and between the first semiconductor substrate 120 and the support substrate 140 reduce, and hence noise reduces. Therefore, detection accuracy and a characteristic of the semiconductor physical quantity sensor, which detects a minute change in capacitance, can be improved and stabilized. In the example shown in FIG. 15, both of the support substrate 140 and the cap 200 are made of glass substrate wafers.

The cap 200 has the recess 203 in an area other than the areas bonded to the sensor peripheral portion 150, the connector portions 160 and the embedded portion 170 (not shown in FIG. 15). Therefore, the cap 200 does not contact the sensor structure 110.

Further, since the cap 200 and the support substrate 140 are electrically insulating members, it is advantageous that the first penetrating electrode 300 is simply formed in the hole 301 of the cap 200. That is, it is not necessary to form an insulating film on the wall of the hole 301. In such a case, the hole 301 is formed by etching, using laser beam, using a mechanical drill, or the like. Further, the hole 301 can be formed after the bonding of the sensor unit 100 and the cap 200. Alternatively, the hole 301 can be previously formed in the glass substrate wafer before the bonding.

In a case of requiring an electrical shielding, a metal film such as an Al film, an amorphous silicon film or a polycrystalline silicon film containing an impurity ($n^+$-type or $p^+$-type) at a high concentration is formed on the support substrate 140 and/or the cap 200 with a thickness of 0.01 μm to 1 μm.

In the example shown in FIG. 15, the first penetrating electrode 300 is disposed in the cap 200. Alternatively, the first penetrating electrode 300 may be disposed in the support substrate 140, similar to the third embodiment. Also, the second and third penetrating electrodes 310, 320 may be disposed in the support substrate 140.

Fifth Embodiment

A fifth embodiment of the present invention will be described hereinafter with reference to FIGS. 16 through 22. A structure different from the first embodiment will be mainly described. In the above-described embodiments, the connector portions 160 are disposed in the sealed chamber 240 together with the sensor structure 110, and the penetrating electrodes 300, 310, 320, 330 are disposed in one of the cap 200 and the support substrate 140 to allow the electrical connection with external parts. In the present embodiment, instead, the connector portions 160 are disposed outside of the sealed chamber 240.

Figure 16:
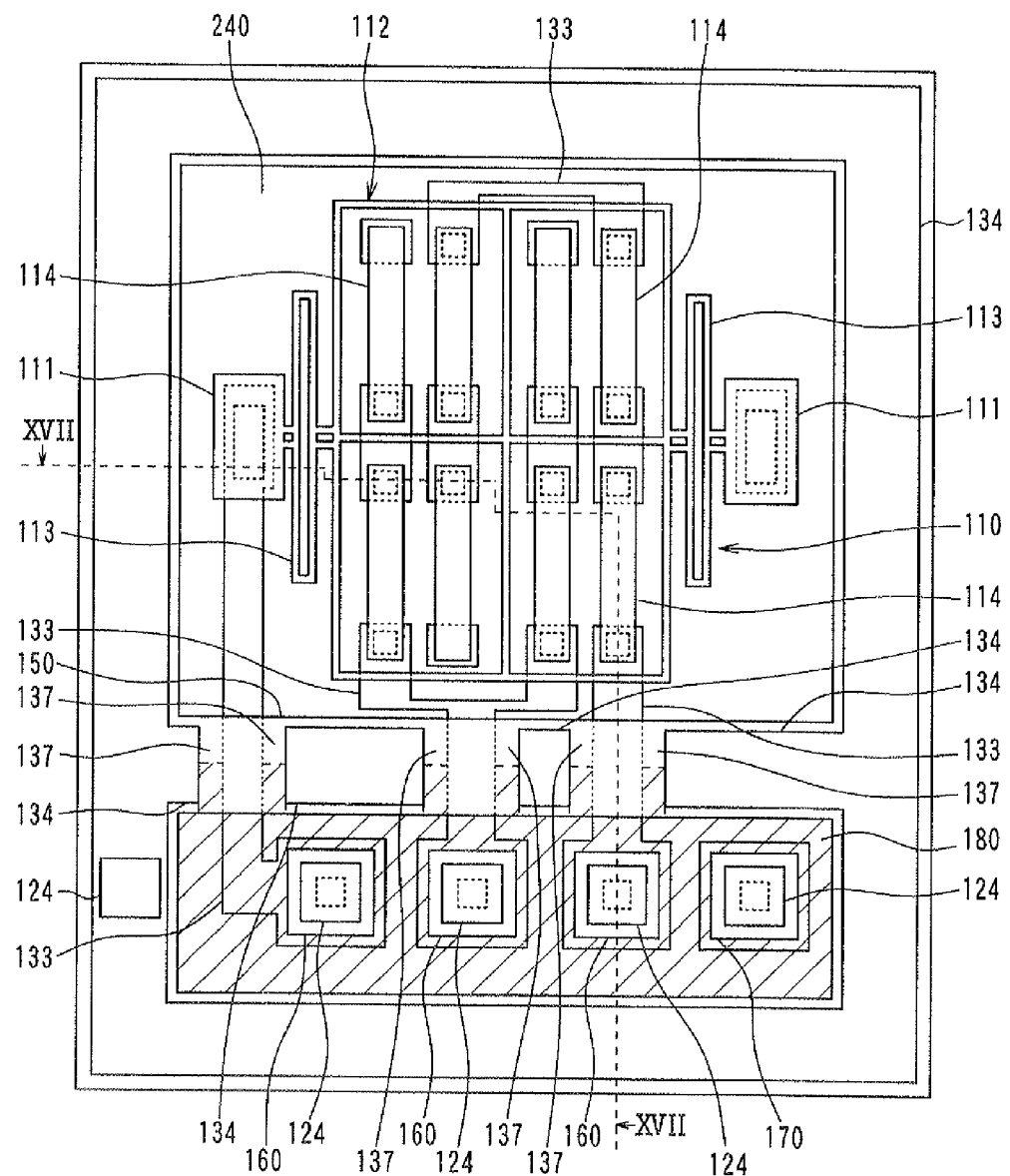
FIG. 16 is a plan view of a semiconductor physical quantity sensor according to a fifth embodiment of the present invention.
Figure 17:
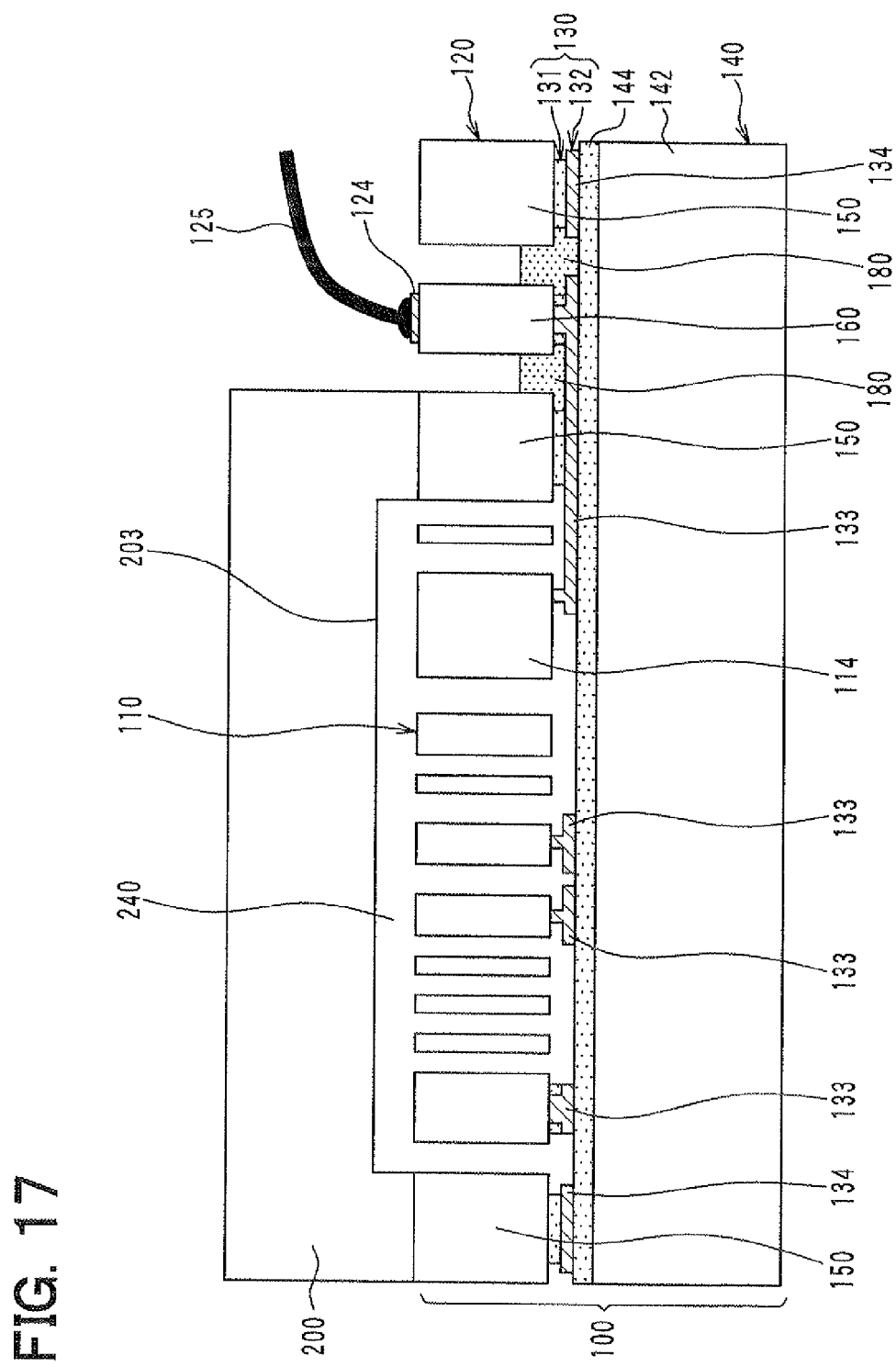
FIG. 17 is a cross-sectional view taken along a line XVII-XVII in FIG. 16.

FIG. 16 is a plan view of a semiconductor physical quantity sensor according to the present embodiment. FIG. 17 is a cross-sectional view taken along a line XVII-XVII in FIG. 16. FIG. 16 is a plan view in which the cap 200 and some parts are illustrated as transparent to show underneath structures for explanatory purposes.

As shown in FIG. 16, also in the present embodiment, the sensor structure 110, the sensor peripheral portion 150, and the connector portions 160 are formed in the first semiconductor substrate 120. The first semiconductor substrate 120 is divided into a predetermined shape such that the sensor peripheral portion 150 has a loop-shaped portion entirely surrounding the periphery of the sensor structure 110 and the connector portions 160 are located in an area outside of the loop-shaped portion in which the sensor structure 110 is disposed.

In other words, the sensor peripheral portion 150 is formed to separate a first area in which the sensor structure 110 is disposed and a second area in which the connector portions 160 are disposed. Also, the sensor peripheral portion 150 is formed to surround at least the periphery of the sensor structure 110 in the loop shape. That is, the sensor peripheral portion 150 at least has the loop-shaped portion entirely surrounding the periphery of the sensor structure 110.

For example, the sensor peripheral portion 150 includes a first portion as the loop-shaped portion that entirely surrounds the periphery of the sensor structure 110 and a second portion that surrounds the connector portions 160. The sensor structure 110 is disposed in the first area provided by the first portion, and the connector portions 160 are disposed in the second area provided by the second portion outside of the first area. The sensor peripheral portion 150 has a connecting portion between the first portion and the second portion.

The pattern portion 130 is formed to correspond to the respective portions divided in the first semiconductor substrate 120. For example, the wiring pattern 133 of the pattern portion 130 is formed such that an end thereof is electrically connected to the sensor structure 110 in the first area and an opposite end thereof is electrically connected to the connector portion 160 in the second area outside of the first area. In this way, since the periphery of the sensor structure 110 is entirely surrounded by the sensor peripheral portion 150, as shown in FIG. 17, the wiring pattern 133 is connected to the connector portion 160 while extending over the sensor peripheral portion 150. That is, the wire pattern 133 intersects the connecting portion of the sensor peripheral portion 150 to electrically connect the sensor structure 110 and the connector portions 160. Thus, the wiring pattern 133 is partly located in a clearance defined between the sensor peripheral portion 150 and the support substrate 140, which corresponds to a thickness of the pattern portion 130.

The peripheral pattern 134 is formed to substantially accord with the layout of the sensor peripheral portion 150. That is, the peripheral pattern 134 is located between the support substrate 140 and the sensor peripheral portion 150, and has a shape surrounding the sensor structure 110. In this case, although the sensor peripheral portion 150 has the shape entirely surrounding the periphery of the sensor structure 110, the peripheral pattern 134 does not entirely surround the periphery of the sensor structure 110. The peripheral pattern 134 is located at the same level as the wiring pattern 133, and the wiring pattern 133 is arranged to extend over the sensor peripheral portion 150. Therefore, the peripheral pattern 134 is formed without intersecting the wiring pattern 133 that is located between the support substrate 140 and the connecting portion of the sensor peripheral portion 150. Accordingly, the peripheral pattern 134 does not have a loop shape entirely surrounding the periphery of the sensor structure 110. That is, the peripheral pattern 134 has a discontinuous loop shape, particularly, at a location corresponding to the connecting portion of the sensor peripheral portion 150, that is, at a location between the first area and the second area.

In the example of FIG. 16, the peripheral pattern 134 is not formed into a double shape, as the example shown in FIG. 1. Also in the present embodiment, the peripheral pattern 134 can be formed into the double shape in view of improvement of hermetically sealing and alleviation of a stress.

Also in the present embodiment, the first semiconductor substrate 120 and the support substrate 140 are joined to each other by directly bonding the wiring pattern 133 and the peripheral pattern 134 to the surface 141 of the support substrate 140. In this case, in an area where the wiring pattern 133 extends over the connecting portion of the sensor peripheral portion 150, a space 137 is formed by the support substrate 140, the pattern portion 130 and the connecting portion of the sensor peripheral portion 150.

The space 137 allows communication between the first area defined by the first portion of the sensor peripheral portion 150 and the second area outside of the first area. In other words, the space 137 allows communication between the first area in which the sensor structure 110 is disposed and the second area in which the connector portions 160 are disposed.

Further, the second area in which the connector portions 160 are disposed is entirely filled with an electrically insulating member 180. The space 137 is also filled with the electrically insulating member 180. That is, the space 137 is sealed by the electrically insulating member 180, and thus the first area and the second area are separated from each other. In the example of FIG. 16, the electrically insulating member 180 is illustrated by oblique lines.

The embedded portion 170 is disposed in the second area. The second semiconductor substrate 142 of the support substrate 140 can be electrically connected to an external part through the embedded portion 170.

As shown in FIG. 17, the cap 200 having the recess 203 is bonded to the sensor unit 100 having the above-described structure. Thus, only the sensor structure 110 is sealed in the sealed chamber 240, and the connector portions 160 and the embedded portions 170 are located outside of the sealed chamber 240. The cap 200 is, for example, made of a single-crystalline silicon substrate.

Further, as shown in FIG. 16, pads 124 are provided on the connector portions 160, the embedded portion 170 and the sensor peripheral portion 150. The pads 124 are, for example, made of aluminum films. As shown in FIG. 17, a bonding wire 125 is bonded to the pad 124 to electrically connect the semiconductor physical quantity sensor to the external part. The semiconductor physical quantity sensor according to the present embodiment has the above-described structure.

Next, a method of manufacturing the semiconductor physical quantity sensor shown in FIGS. 16 and 17 will be described with reference to FIGS. 18A, 18B and 19 through 22. Also in the present embodiment, the semiconductor physical quantity sensor is manufactured in a state of wafer.

In a step shown in FIG. 18A, similar to the step shown in FIG. 4A, the first semiconductor substrate 120 is prepared, and the electrically insulating film 131 is formed on the surface 121 of the first semiconductor substrate 120. The contact holes 136 are formed in the insulating film 131 at locations corresponding to the anchors 111, the fixed electrodes 114, the connector portions 160, the embedded portion 170 and the sensor peripheral portion 150. As the metal layer 132, the aluminum film is formed on the insulating film 131 such that the contact holes 136 are filled with the aluminum film. The aluminum film is patterned into a predetermined shape to form the wiring pattern 133 having the contact portion 135 and the peripheral pattern 134.

In the step shown in FIG. 18A, the wiring pattern 133 is formed to connect an outer end portion of the surface 121 of the first semiconductor substrate 120 and the sensor structure 110. Also, the peripheral pattern 134 is formed to surround the area in which the sensor structure 110 is formed, on the surface 121 of the first semiconductor substrate 120. Further, the peripheral pattern 134 is formed to be located between respective portions of the wiring pattern 133.

In a step shown in FIG. 18B, similar to the step shown in FIG. 4B, the support substrate 140 is prepared. In this case, the first insulating layer 144 is formed by thermally-oxidizing the surface 143 of the second semiconductor substrate 142. Then, the first semiconductor substrate 120 and the support substrate 140 are placed such that the pattern portion 130 is opposed to the surface 141 of the support substrate 140. Further, the first semiconductor substrate 120 and the support substrate 140 are joined to each other by directly bonding the pattern portion 130 and the surface 141 of the support substrate 140. Thus, the end of the wiring pattern 133 is located in the first area surrounded by the sensor peripheral portion 150 and the opposite end of the wiring pattern 133 is located outside of the first area. Further, the opposite surface 122 of the first semiconductor substrate 120 is thinned such as by grinding or polishing.

Figure 19:
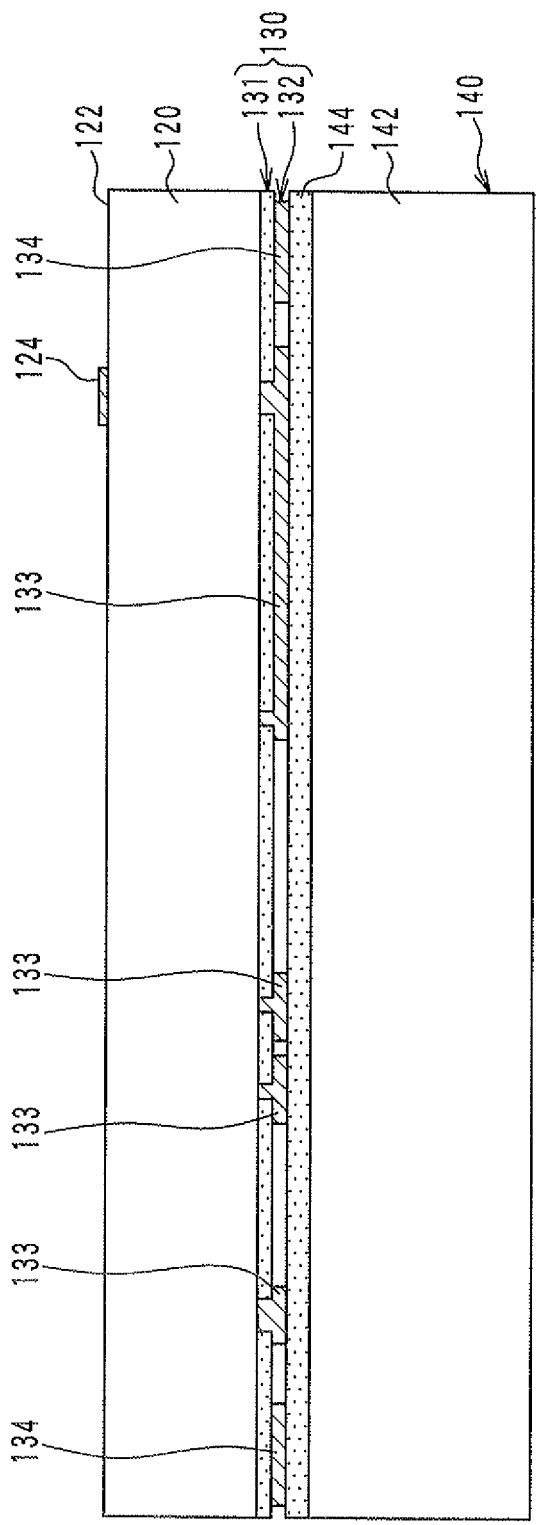

In a step shown in FIG. 19, an aluminum film is formed on the surface 122 of the first semiconductor substrate 120, such as by the CVD technique. The aluminum film is patterned. Thus, the pads 124 are formed on the surface 122 of the first semiconductor substrate 120 at locations corresponding to the connector portions 160, the embedded portion 170 and the sensor peripheral portion 150.

Figure 20:
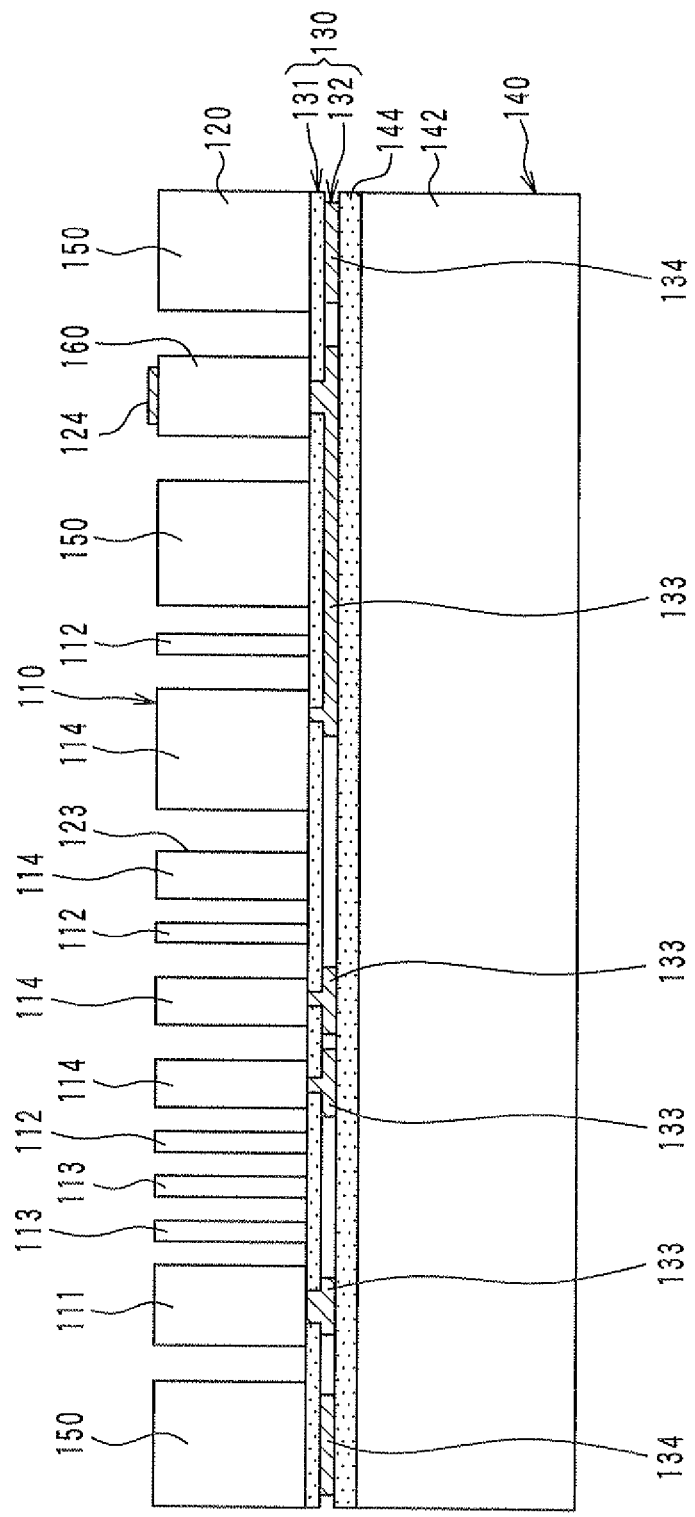

In a step shown in FIG. 20, similar to the step shown in FIG. 5B, the trench grooves 123 are formed in the first semiconductor substrate 120. The trench grooves 123 are perpendicular to the surface 121 of the first semiconductor substrate 120, and reach the insulating film 131 of the pattern portion 130. By forming the trench groove 123, the sensor structure 110, the sensor peripheral portion 150, the connector portions 160 and the embedded portion 170 are formed.

In this case, the sensor peripheral portion 150 is formed to surround the periphery of the sensor structure 110 in the loop shape and to surround the periphery of the connector portions 160 and the embedded portion 170 in the loop shape. That is, the sensor peripheral portion 150 is formed to have the first portion forming the first area and the second portion forming the second area, which is outside of the first area. The sensor structure 110 is formed in the first area, and the connector portions 160 and the embedded portion 170 are formed in the second area outside of the first area.

Figure 21:
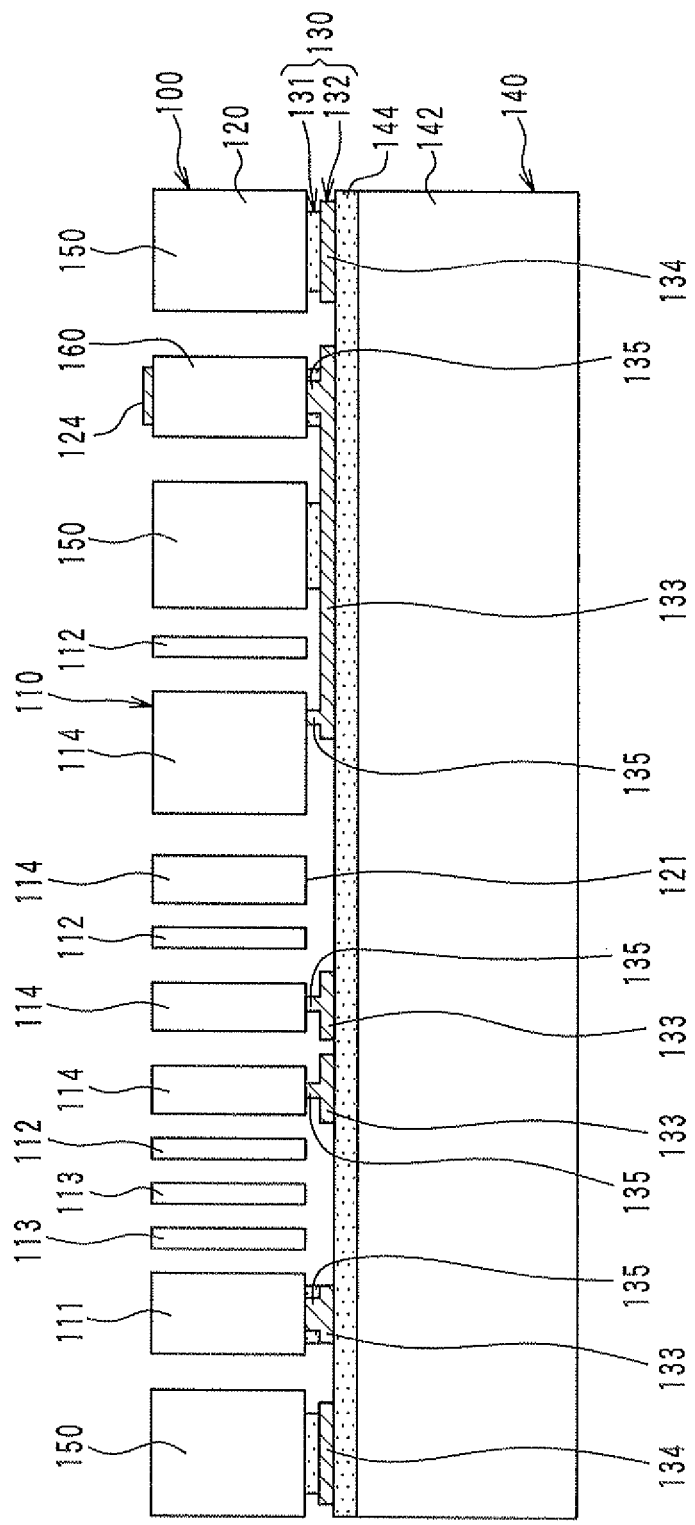

In a step shown in FIG. 21, at least portions of the insulating film 131 located under the movable electrode 112 and the beams 113 are removed. Thus, the movable electrode 112 and the beams 113 become in a condition spaced from the support substrate 140 by a predetermined distance and thus floated on the support substrate 140.

In this way, when the portions of the insulating film 131 of the pattern portion 130 are removed, the space 137 surrounded by the support substrate 140, the pattern portion 130 and the sensor peripheral portion 150 and communicating the first area and the second area is formed.

Figure 22:
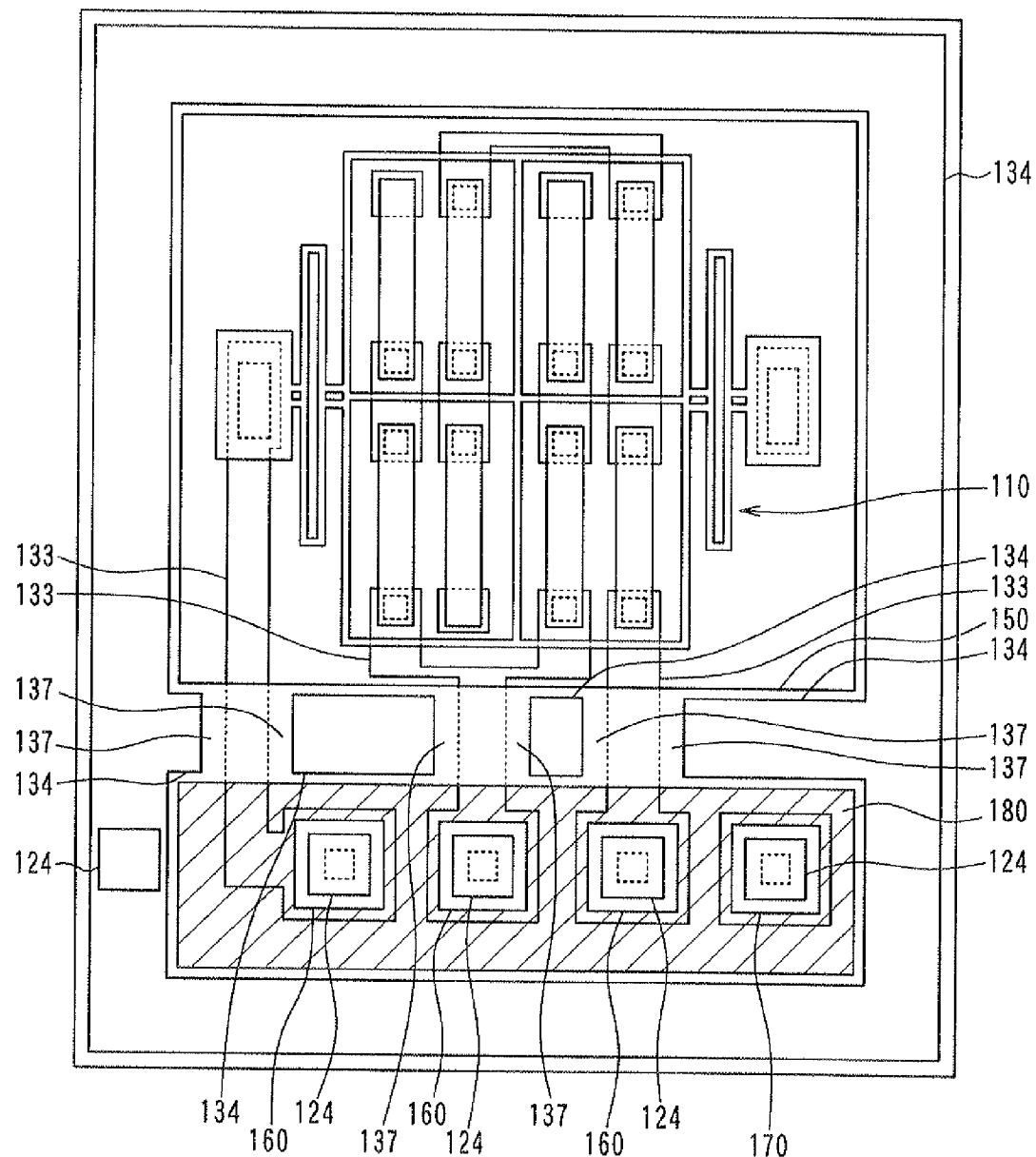
FIG. 22 is a plan view showing a step of the process performed after a step shown in FIG. 21.

In a step shown in FIG. 22, the electrically insulating member 180 is filled entirely in the second area, such as by an ink-jetting technique. The electrically insulating member 180 is, for example, made of glass with a low melting point or a resin. Then, the electrically insulating member 180 is heated and moved toward the space 137 to seal the space 137.

Thereafter, the cap 200 is bonded to the sensor peripheral portion 150 so that the sensor structure 110 is hermetically sealed by the cap 200, the sensor peripheral portion 150, the peripheral pattern 134 of the pattern portion 130, the electrically insulating member 180 and the support substrate 140. The wafer is cut into multiple physical quantity sensors. Accordingly, the semiconductor physical quantity sensor is manufactured.

In this way, the sensor structure 110 is solely surrounded by the sensor peripheral portion 150, and the connector portions 160 are disposed outside of the area in which the sensor structure 110 is disposed. In this case, the space 137 surrounded by the sensor peripheral portion 150, the support substrate 140 and the pattern portion 130 is closed by the electrically insulating member 180. Therefore, the sealing structure for hermetically sealing the sensor structure 110 can be easily formed only by bonding the cap 200 to the sensor peripheral portion 150.

Sixth Embodiment

Figure 23:
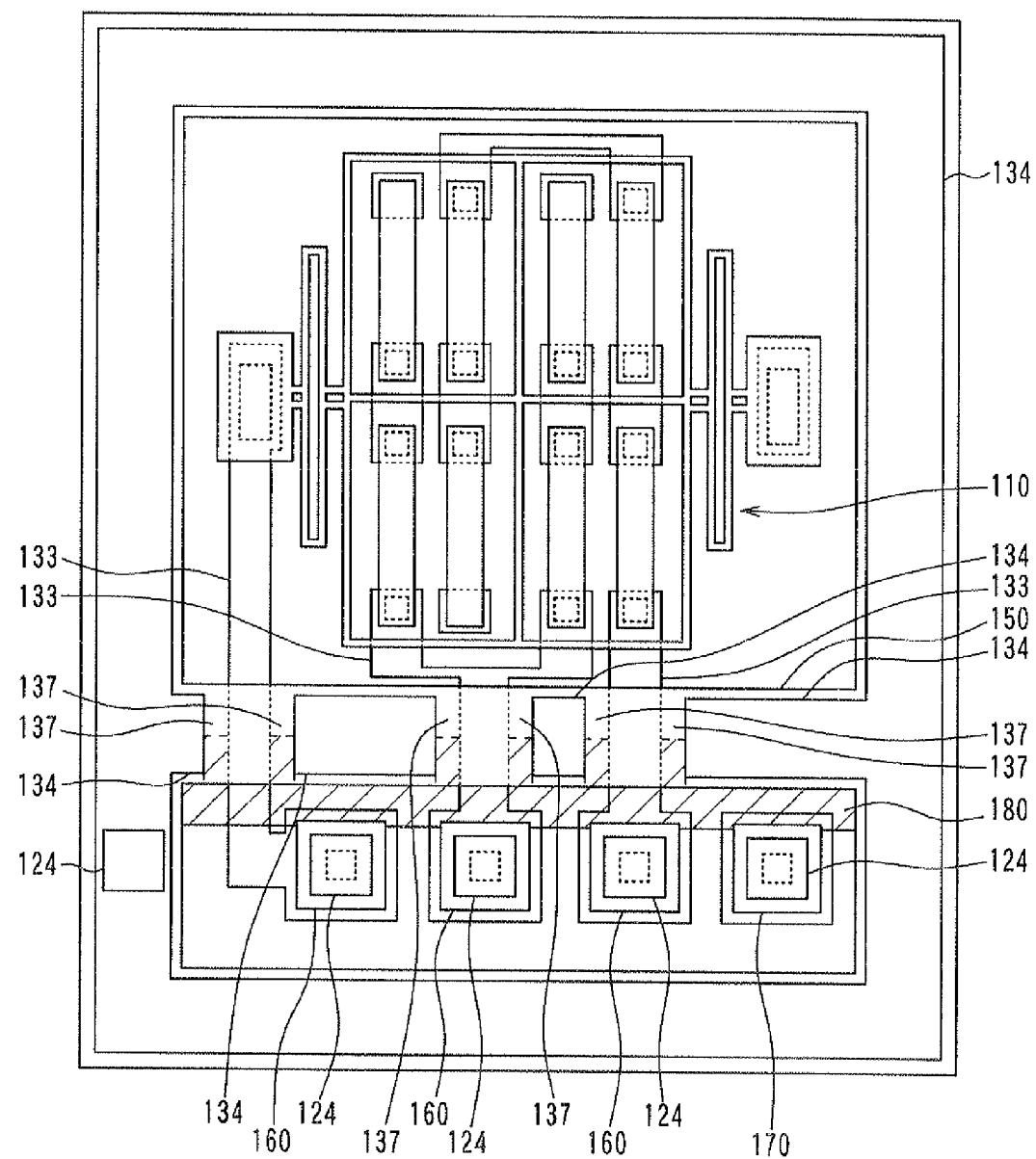
FIG. 23 is a plan view of a semiconductor physical quantity sensor according to a sixth embodiment of the present invention.

A sixth embodiment will be described hereinafter with reference to FIGS. 23 and 24. A structure different from the fifth embodiment will be mainly described. In the fifth embodiment, the second area in which the connector portions 160 are disposed are entirely filled with the electrically insulating member 180. In the present embodiment, on the other hand, the electrically insulating member 180 is partly disposed in the second area. For example, as shown in FIG. 23, the electrically insulating member 180 is disposed in the second area at a region adjacent to the sensor structure 110.

That is, in the present embodiment, the second portion of the sensor peripheral portion 150 needs not to entirely surround the periphery of the connector portions 160 and the embedded portion 170. The sensor peripheral portion 150 needs not to have the loop shape.

Figure 24:
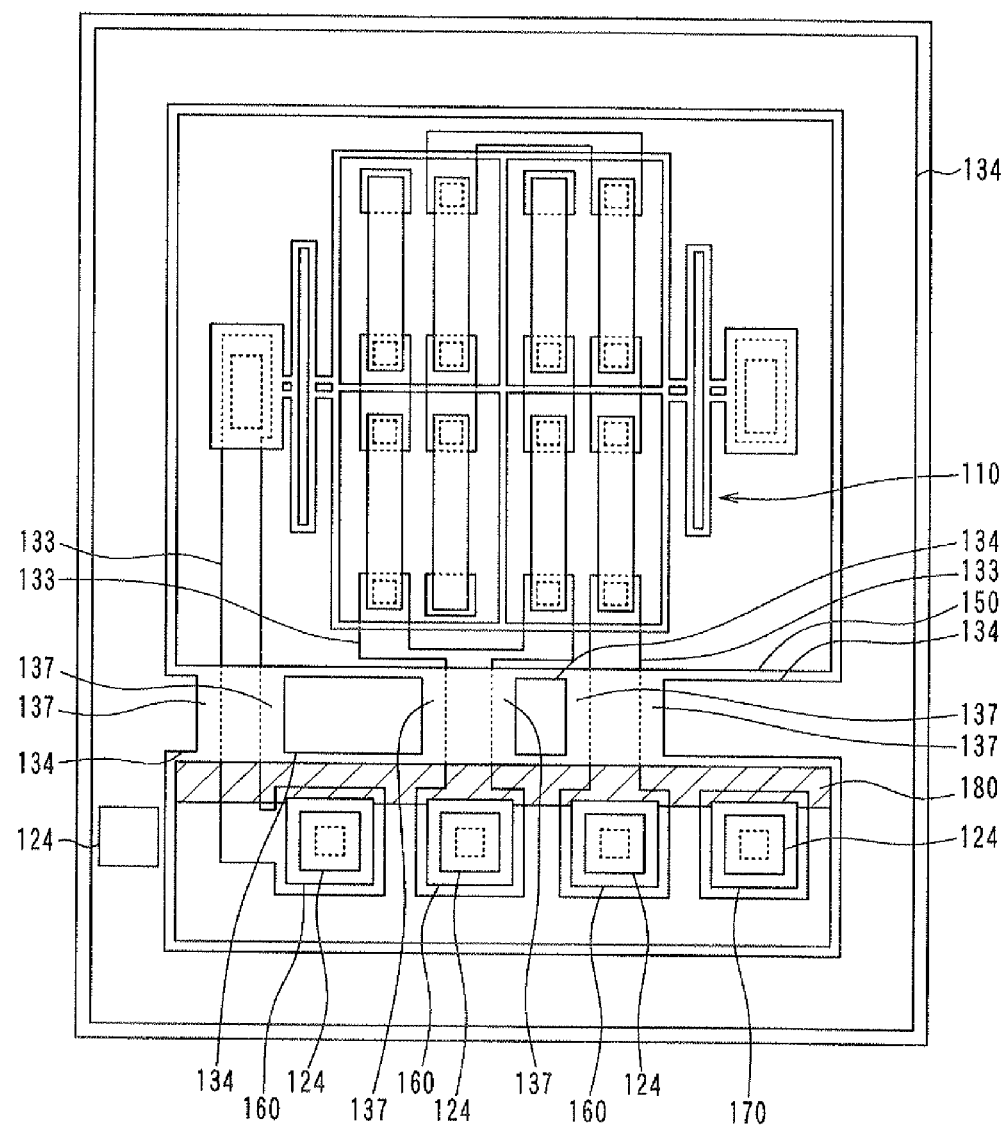
FIG. 24 is a plan view showing a process of manufacturing the semiconductor physical quantity sensor according to the sixth embodiment.

In this case, as shown in FIG. 24, the electrically insulating member 180 is deposited at a portion adjacent to the sensor structure 110 in the second area, and is moved by heating. As such, the space 137, which is surrounded by the sensor peripheral portion 150, the support substrate 140 and the pattern portion 130, can be closed by the electrically insulating member 180. Since the electrically insulating member 180 is disposed at a portion of the second area, the amount of the electrically insulating member 180 can be reduced, and an effect of the electrically insulating member 180 on the sensor unit 100 can be reduced.

Seventh Embodiment

A seventh embodiment will be described hereinafter with reference to FIGS. 25 and 26. A structure different from the first to sixth embodiments will be mainly described. In the fifth and sixth embodiments, the sealed chamber 240 is hermetically sealed using the electrically insulating member 180. In the present embodiment, on the other hand, the sealed chamber 240 is hermetically sealed using the first insulating layer 144, which forms the support substrate 140, without using the electrically insulating member 180.

Figure 25:
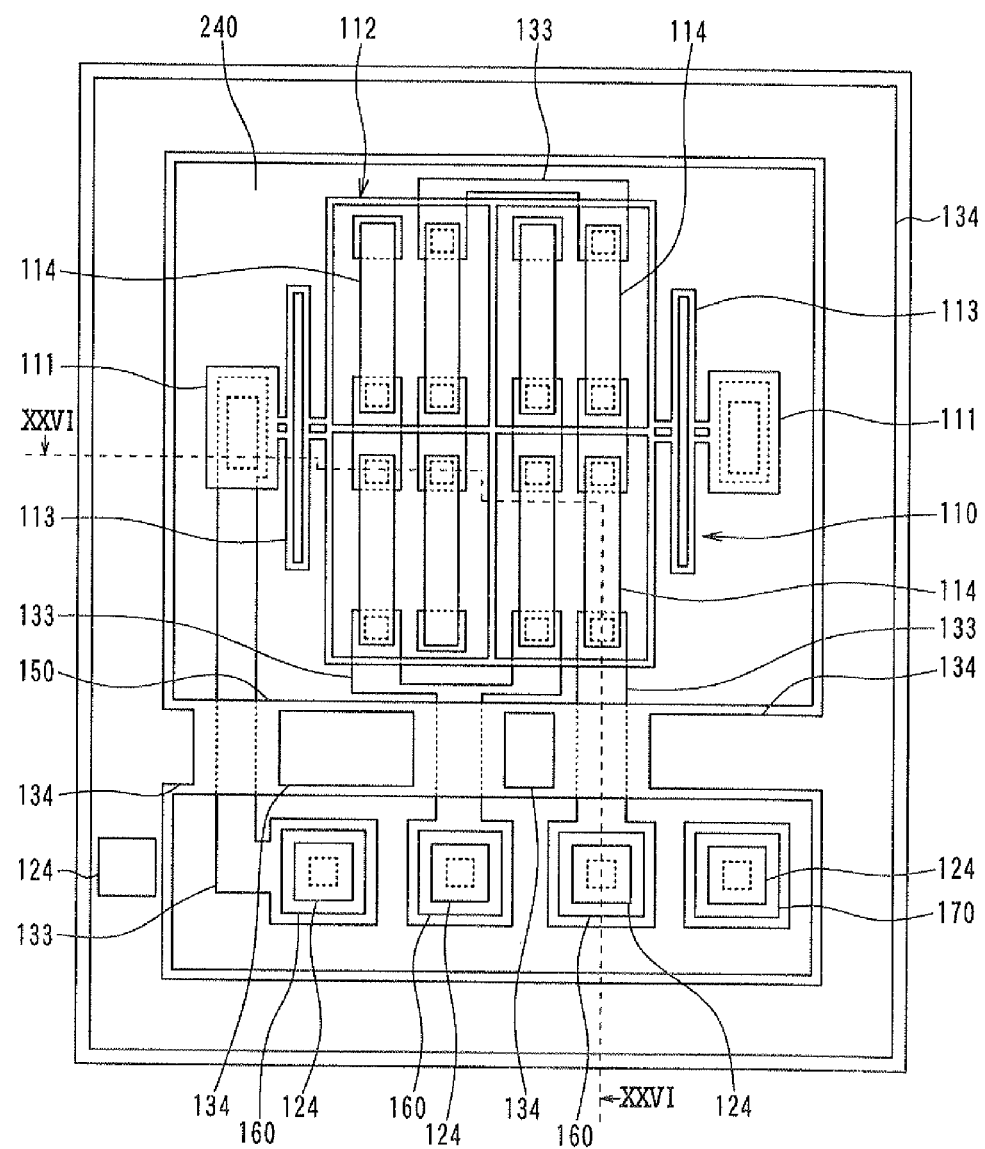
FIG. 25 is a plan view of a semiconductor physical quantity sensor according to a seventh embodiment of the present invention.

FIG. 25 is a plan view of a semiconductor physical quantity sensor according to the present embodiment. FIG. 26 is a cross-sectional view taken along a line XXVI-XXVI in FIG. 25. FIG. 25 is a plan view in which the cap 200 is illustrated as transparent to show underneath structures for explanatory purposes.

A planar structure of the semiconductor physical quantity sensor according to the present embodiment is different from a planar structure of the semiconductor physical quantity sensor shown in FIG. 16 because the electrically insulating member 180 is not disposed. The planar structure other than the electrically insulating member 180 is similar to the planar structure shown in FIG. 16.

Figure 26:
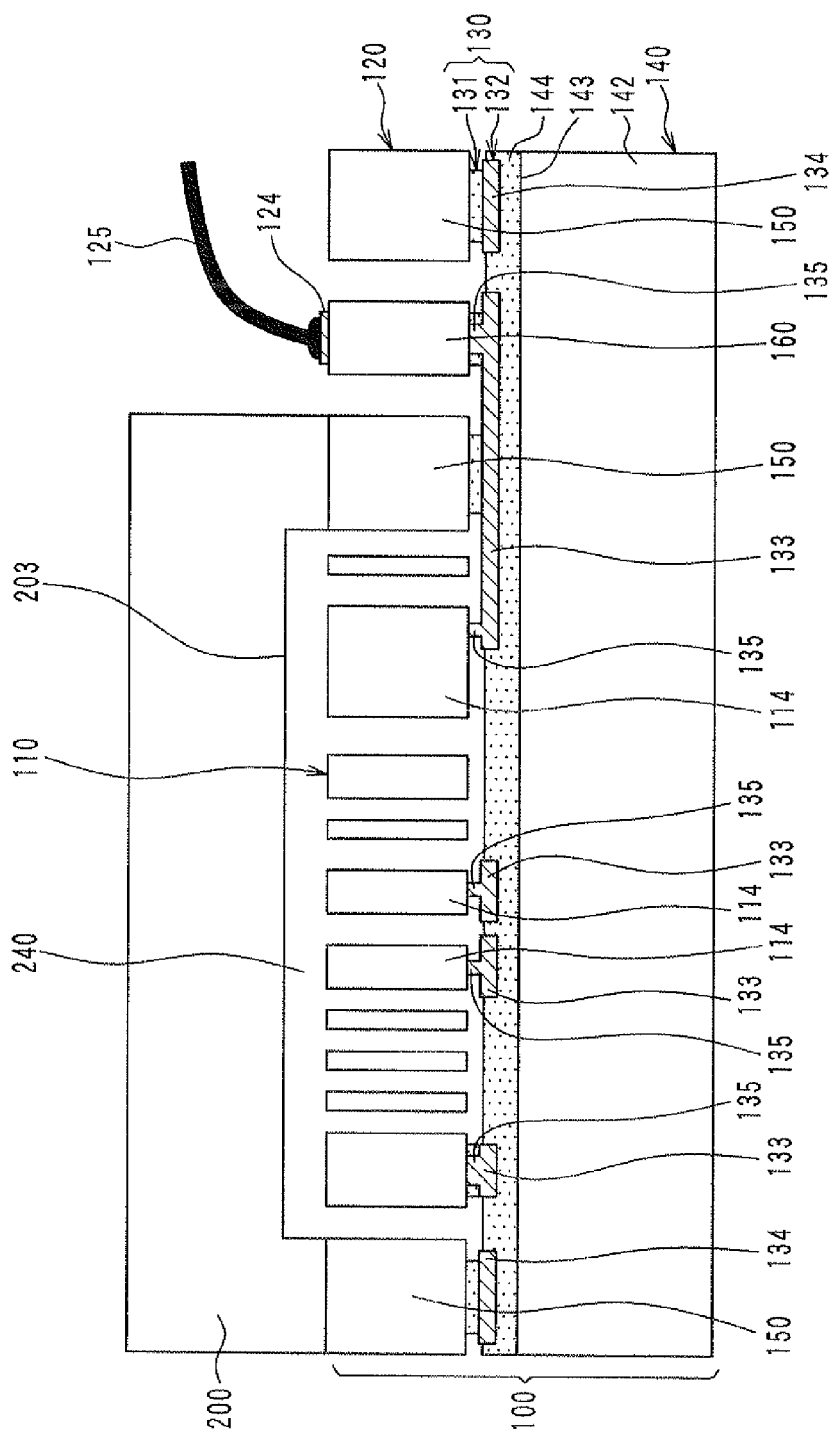
FIG. 26 is a cross-sectional view taken along a line XXVI-XXVI in FIG. 25.

Further, as shown in FIG. 26, the wiring pattern 133 and the peripheral pattern 134 of the pattern portion 130 are embedded in the first insulating layer 144 of the support substrate 140. Particularly, between the support substrate 140 and the part of the sensor peripheral portion 150 that intersects the wiring pattern 133, the wiring pattern 133 and the peripheral pattern 134 are embedded in the first insulating layer 144 so that the space communicating the first area in which the sensor structure 110 is disposed and the second area outside of the first area does not exist. In this way, the first semiconductor substrate 120 and the support substrate 140 are joined to each other in a manner that the pattern portion 130 is partly embedded in the first insulating layer 144.

As described above, the pattern portion 130 is located between the support substrate 140 and the connecting portion of the sensor peripheral portion 150 that intersects the wiring pattern 133. Therefore, the first area, which is surrounded by the sensor peripheral portion 150 and in which the sensor structure 110 is disposed, is completely separated from the second area outside of the first area. As such, when the cap 200 is bonded to the sensor peripheral portion 150, the sensor structure 110 can be hermetically sealed in the sealed chamber 240.

The wiring pattern 133 and the peripheral pattern 134 are embedded in the first insulating layer 144, and the contact portions 135 project from the surface of the first insulating layer 144. Therefore, the fixed electrodes 114 and the movable electrode 112 are spaced from the surface of the first insulating layer 144 by the height of the contact portions 135, and hence the movable electrode 112 is movable relative to the fixed electrodes 114.

The bonding wire 125 is bonded to the connector portion 160 through the pad 124 to allow electrical connection between the sensor structure 110 and the external part.

Next, a method of manufacturing the semiconductor physical quantity sensor shown in FIGS. 25 and 26 will be described with reference to FIGS. 27 to 30. Also in the present embodiment, the semiconductor physical quantity sensor is manufactured in a state of wafer.

First, similar to the step shown in FIG. 18B, the pattern portion 130 including the wiring pattern 133 and the peripheral pattern 134 is formed on the first surface 121 of the first semiconductor substrate 120. Also, the support substrate 140 having the first insulating layer 144 is prepared. The first insulating layer 144 is formed by thermally oxidizing the surface 143 of the second semiconductor substrate 142.

In the present embodiment, since the wiring pattern 133 and the peripheral pattern 134 are to be embedded in the first insulating layer 144, the first insulating layer 144 is formed to have a thickness greater than that of the metal layer 132. As the first insulating layer 144, an electrically insulating member such as glass having a low melting point or resin, or a bonding material can be used.

Figure 27:
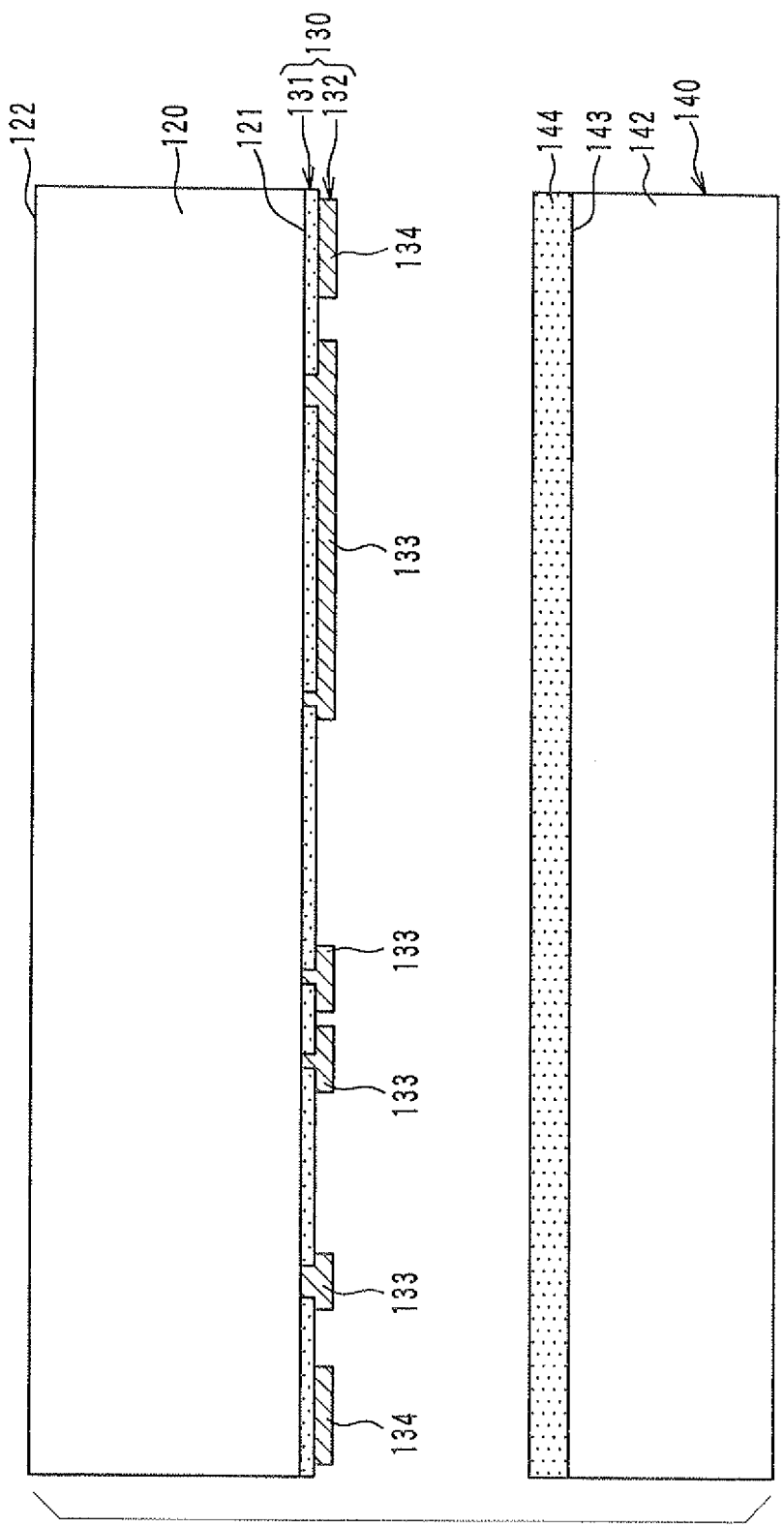
FIGS. 27, 28, 29 and 30 are cross-sectional views showing a process of manufacturing the semiconductor physical quantity sensor according to the seventh embodiment.

In a step shown in FIG. 27, the pattern portion 130 of the first semiconductor substrate 120 is opposed to the surface 141 of the support substrate 140, and the first insulating layer 144 is melted by heating. Then, the pattern portion 130 is pressed against the melted first insulating layer 144, and the wiring pattern 133 and the peripheral pattern 134 are embedded in the first insulating layer 144 so that a clearance between the first insulating layer 144 and the pattern portion 130 disappears. The first insulating layer 144 is formed on the surface 143 of the second semiconductor substrate 142. In this case, therefore, the first semiconductor substrate 120 should not be excessively pressed against the second semiconductor substrate 142, so as to avoid the wiring pattern 133 and the peripheral pattern 134 from contacting and electrically conducting with the second semiconductor substrate 142.

In this way, the insulating film 131 of the pattern portion 130 is bonded to the first insulating layer 144 so that the wiring pattern 133 and the peripheral pattern 134 are embedded in the first insulating layer 144. Thus, there is no space, such as a clearance, between the pattern portion 130 and the first insulating layer 144. Further, the surface 122 of the first semiconductor substrate 120 is thinned, such as by grinding or polishing.

When the pattern portion 130 and the first insulating layer 144 are bonded in the above-described manner, the wiring pattern 133 is located to extend across an area where the sensor peripheral portion 150 is to be formed. That is, the end of the wiring pattern 133 is located in an area corresponding to the first area surrounded by the first portion of the sensor peripheral portion 150 and the opposite end of the wiring pattern 133 is located in an area corresponding to the second area outside of the first area.

Figure 28:
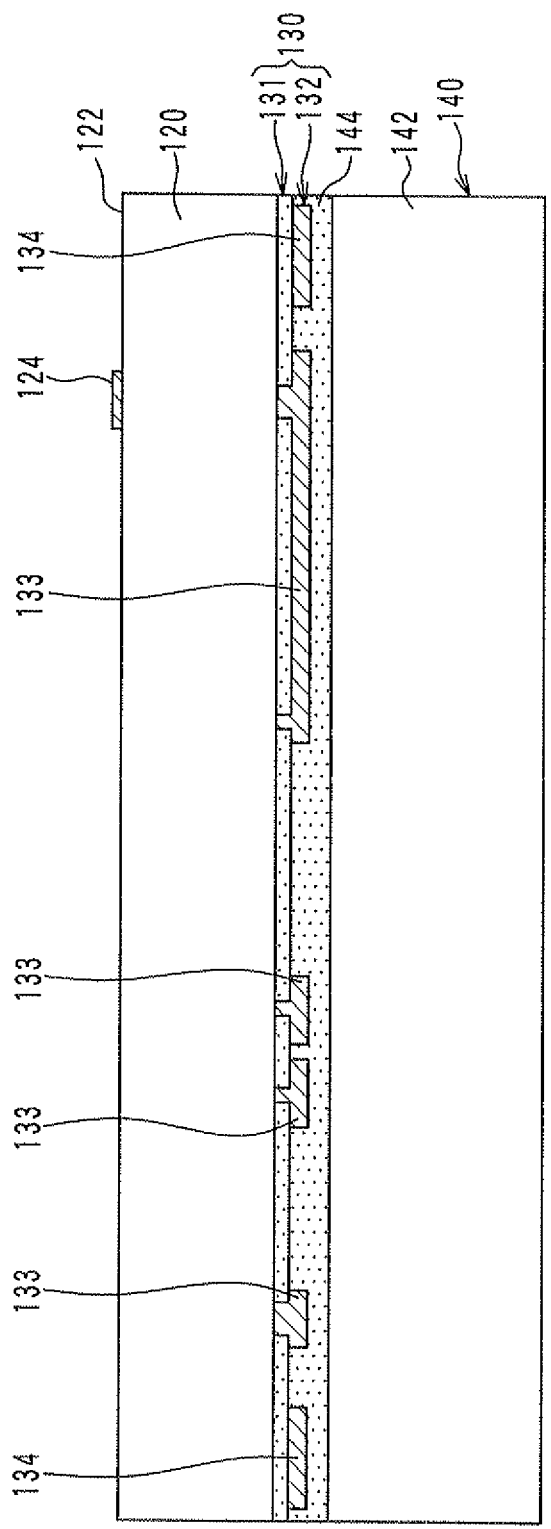

Next, in a step shown in FIG. 28, similar to the step shown in FIG. 19, an aluminum film is formed on the surface 122 of the first semiconductor substrate 120, such as by the CVD technique. The aluminum film is patterned to form the pads 124 at locations corresponding to the connector portions 160, the embedded portion 170 and the sensor peripheral portion 150.

Figure 29:
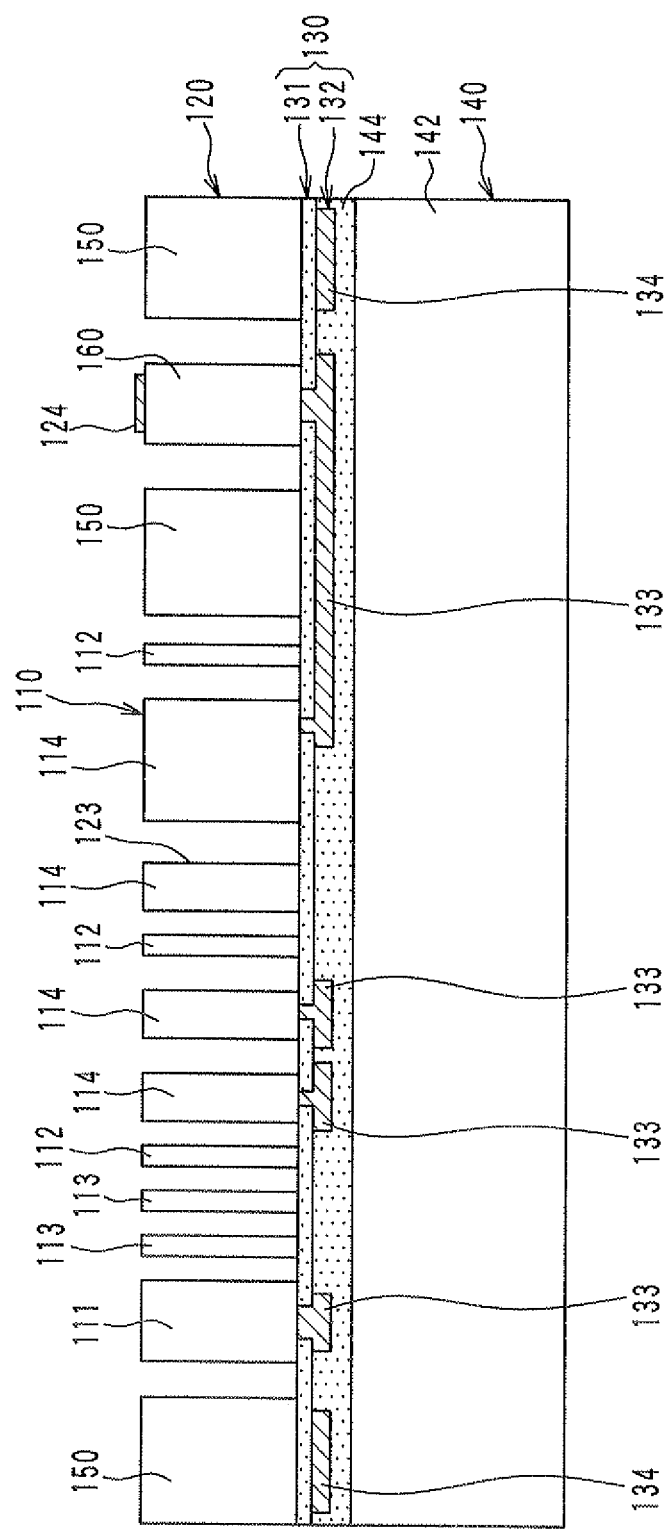

In a step shown in FIG. 29, similar to the step shown in FIG. 20, the trench grooves 123 are formed in the first semiconductor substrate 120 to form the sensor structure 110, the sensor peripheral portion 150, the connector portions 160 and the embedded portion 170 in the first semiconductor substrate 120.

Thus, the sensor peripheral portion 150 is formed to entirely surround the periphery of the sensor structure 110. Also, the sensor peripheral portion 150 is connected to the pattern portion 130 at a location corresponding to the peripheral pattern 134. The sensor structure 110 is located in the first area surrounded by the sensor peripheral portion 150. Also, the sensor structure 110 is electrically connected to the end of the wiring pattern 133. The connector portions 160 are located outside of the first area. The connector portions 160 are electrically connected to the opposite end of the wiring pattern 133.

Figure 30:
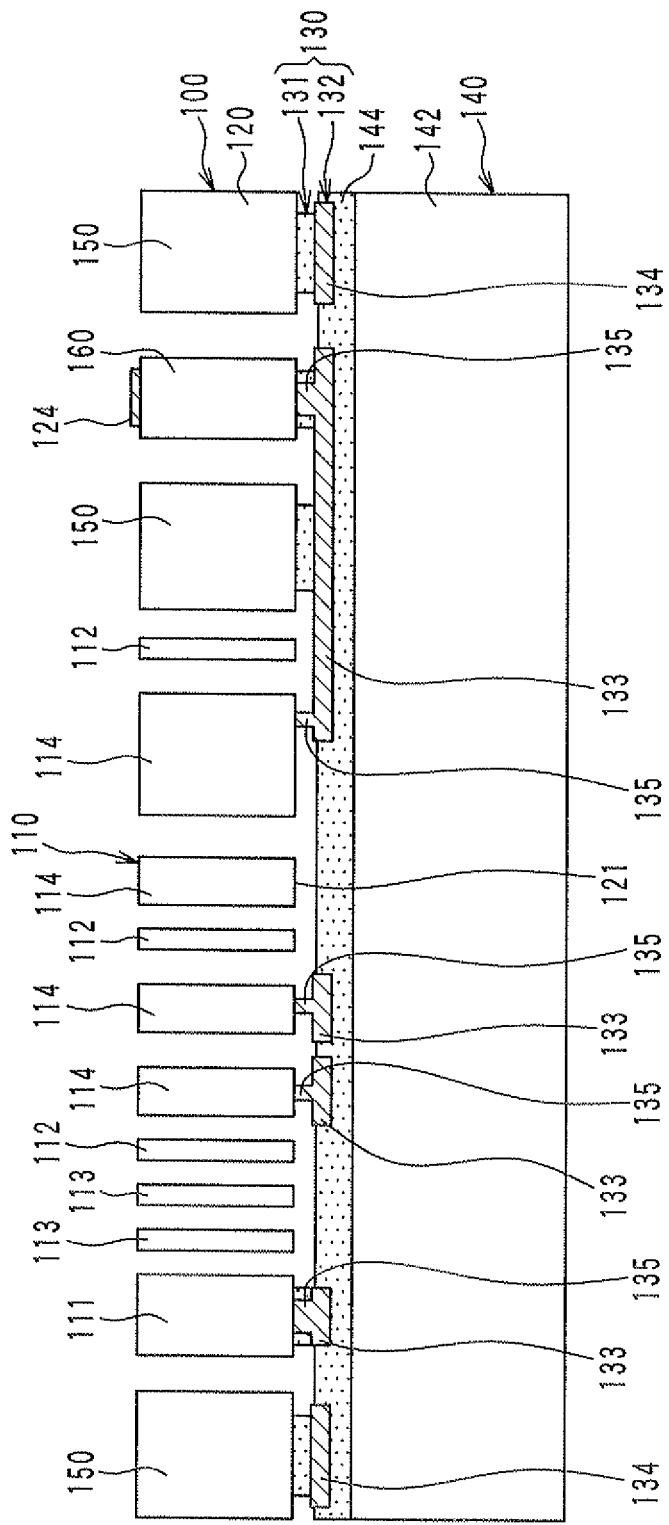

In a step shown in FIG. 30, similar to the step shown in FIG. 21, at least the portion of the insulating film 131 under the movable electrode 112 and the beams 113 is removed by etching so that the movable electrode 112 and the beams 113 are floated on the support substrate 140.

Even if the insulating film 131 under the movable electrode 112 and the beams 113 is removed by etching, the first insulating layer 144 and the insulating film 131 remain in a layered condition, between the second semiconductor substrate 142 and the part of the sensor peripheral portion 150 that extends across the wiring pattern 133. Therefore, the first area in which the sensor structure 110 is disposed and the second area in which the connector portions 160 are disposed are completely separated from each other by the sensor peripheral portion 150.

After the step of forming the sensor structure 110, the cap 200 is bonded to the sensor peripheral portion 150. Thus, the sensor structure 110 is hermetically sealed by the cap 200, the sensor peripheral portion 150, the pattern portion 130 and the support substrate 140. The wafer is divided into each physical quantity sensor. In this way, the semiconductor physical quantity sensor is manufactured.

Accordingly, the sealing structure of the sensor structure 110 can be easily formed by embedding the wiring pattern 133 and the peripheral pattern 134 of the pattern portion 130 in the first insulating layer 144 and bonding the cap 200 to the sensor peripheral portion 150.

Eighth Embodiment

Figure 31:
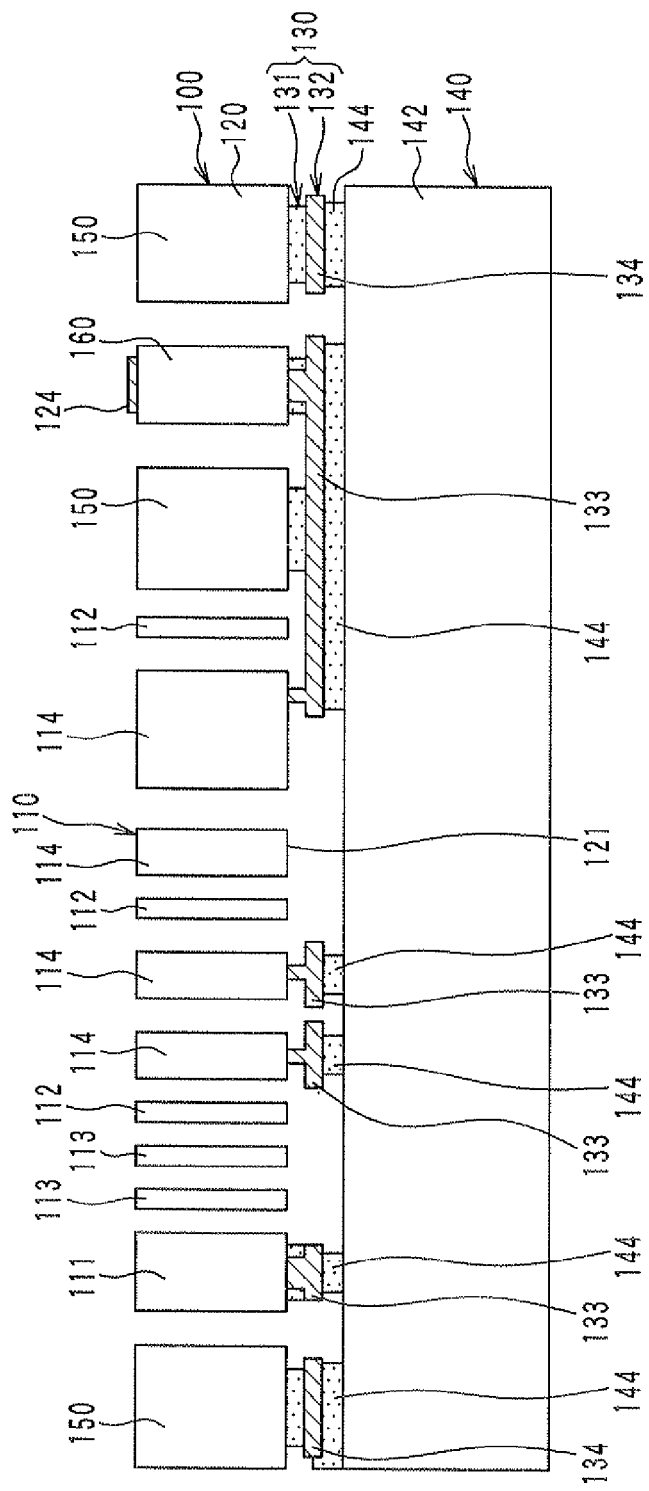
FIG. 31 is a cross-sectional view showing a process of manufacturing a semiconductor physical quantity sensor according to an eighth embodiment of the present invention.

An eighth embodiment will be described hereinafter with reference to FIG. 31. A structure different from the seventh embodiment will be mainly described. In the seventh embodiment, at least the portion of the insulating film 131 under the movable electrode 112 and the beams 113 is removed by etching. Alternatively, as shown in FIG. 31, the portion of the insulating film 131 under the movable electrode 112 and the beams 113 can be completely removed by etching. In such a case, an effect of parasitic capacitance of the support substrate 140 can be reduced.

Other Embodiments

In the above-described embodiments, the wiring pattern 133 and the peripheral pattern 134 are formed in the metal layer 132 of the pattern portion 130. A shield pattern for electrically shielding can be formed in the metal layer 132.

In the third embodiment, the first to third penetrating electrodes 300, 310, 320 are disposed in the support substrate 140 to be electrically connected to the connector portions 160 and the like. However, in the case where the first to third penetrating electrodes 300, 310, 320 are disposed in the support substrate 140, it is not always necessary to form the connector portions 160 in the first semiconductor substrate 120.

Figure 32:
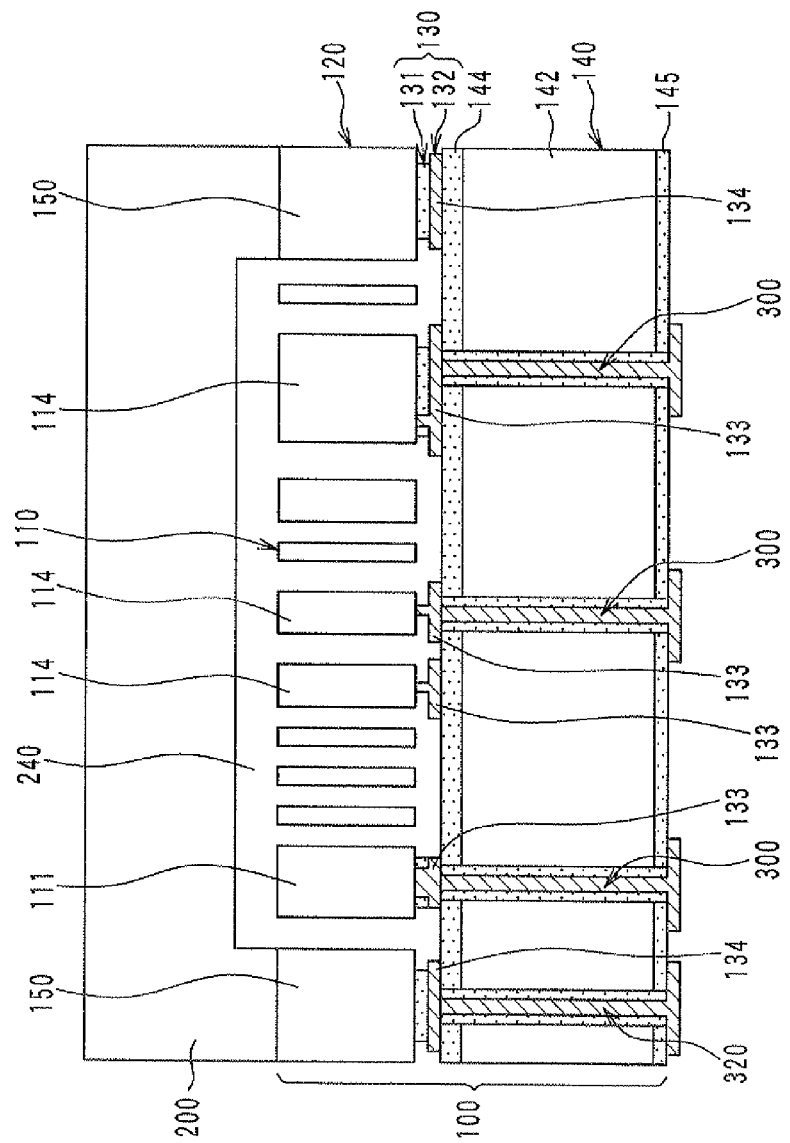
FIG. 32 is a cross-sectional view of a semiconductor physical quantity sensor according to a first modified embodiment of the present invention.
Figure 33:
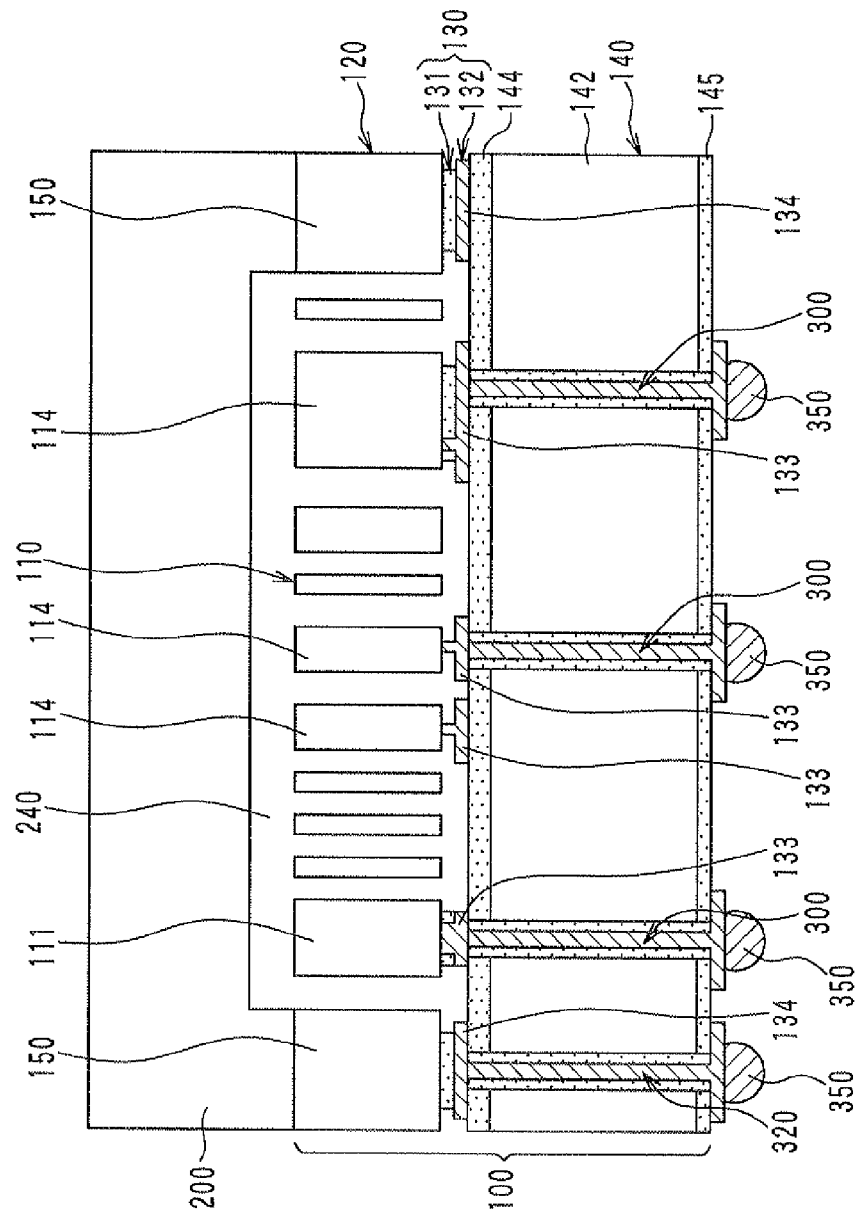
FIG. 33 is a cross-sectional view of a semiconductor physical quantity sensor according to a second modified embodiment of the present invention.

As shown in FIG. 32, for example, the first penetrating electrodes 300 and the third penetrating electrode 320 can be directly and electrically connected to the respective portions of the wiring pattern 133. In such a case, as shown in FIG. 33, the bonding balls 350 can be formed on the first penetrating electrodes 300 and the third penetrating electrode 320. Although not illustrated in FIG. 33, the bonding ball 350 can be also formed on the second penetrating electrode 310.

Figure 34:
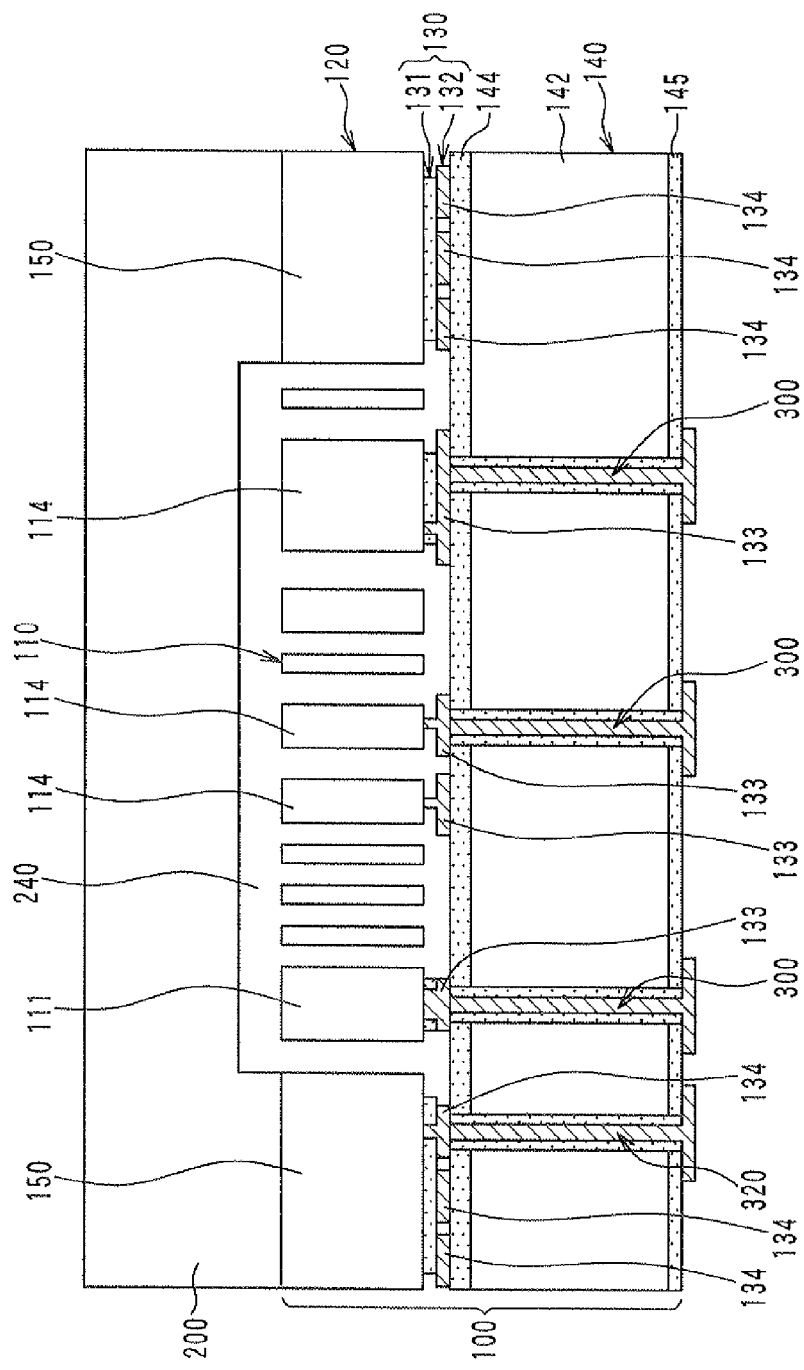
FIG. 34 is a cross-sectional view of a semiconductor physical quantity sensor according to a third modified embodiment of the present invention.
Figure 35:
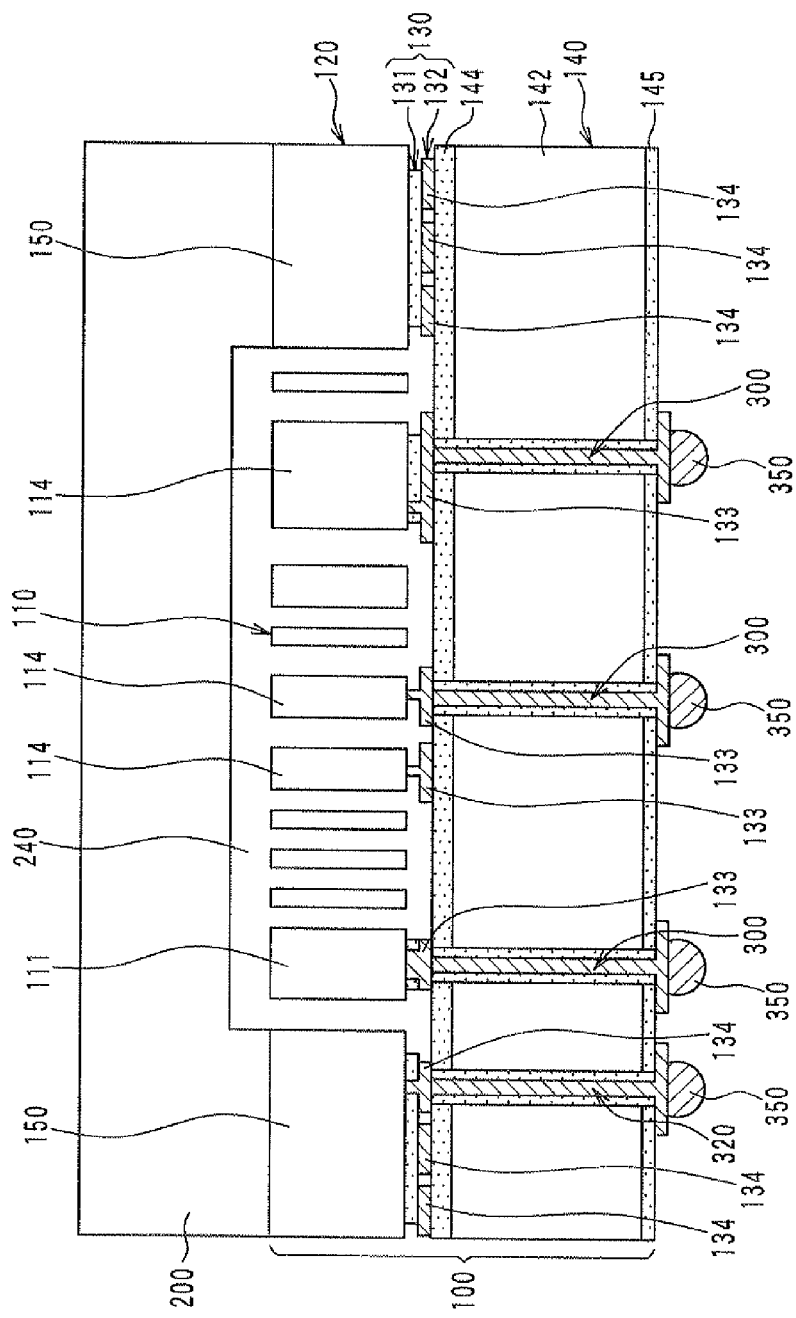
FIG. 35 is a cross-sectional view of a semiconductor physical quantity sensor according to a fourth modified embodiment of the present invention.

In the example shown in FIGS. 12 through 14, the peripheral pattern 143 is formed into the double loop shape. In the example shown in FIG. 33, the peripheral pattern 134 is formed in a single loop shape. As another example, the peripheral pattern 134 can be formed into a triple loop shape, as shown in FIG. 34. In such a case, the stress applied to the peripheral pattern 134 can be further dispersed. Further, the sealing of the sealed chamber 240 further improves. Further, as shown in FIG. 35, the bonding balls 350 can be formed on the first and third penetrating electrodes 300, 320. Moreover, the bonding ball 350 can be formed also on the second penetrating electrode 310.

Figure 36:
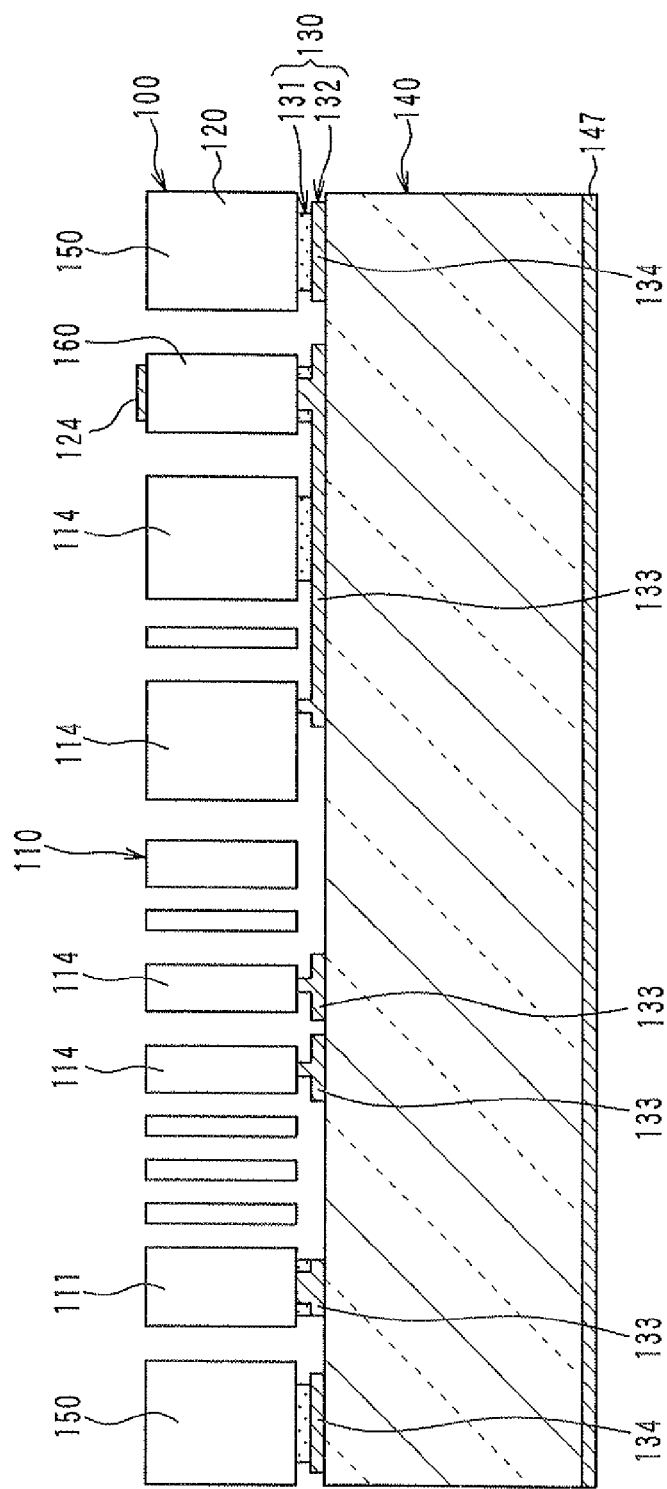
FIG. 36 is a cross-sectional view of a semiconductor physical quantity sensor according to a fifth modified embodiment of the present invention.

In the example shown in FIG. 15, the support substrate 140 and the cap 200 are made of glass. In a case requiring electrical shielding, as shown in FIG. 36, a shield layer 147 can be formed on the surface of the support substrate 140. The shield layer 147 has a thickness of 0.01 µm to 1 µm. Further, the shield layer 147 is, for example, made of a metal film such as an aluminum film. Alternatively, the shield layer 147 can be made of an amorphous silicon or a polycrystalline silicon, which contains a high concentration of impurity ($n^+$-type or $p^+$-type). In FIG. 36, the shield layer 147 on the support substrate 140 is illustrated. In addition, the cap 200 can have such a shield layer 147.

In the fifth and sixth embodiments, the pads 124 are formed on the sensor peripheral portion 150 so as to electrically connect the sensor peripheral portion 150 and the external part. As another example, as shown in FIG. 37A, a hole 151 is formed to pass through the sensor peripheral portion 150, the pattern portion 130 and the first insulating layer 144 and reach the second semiconductor substrate 142. A pad 126 can be formed on the wall forming the hole 151. In this case, the sensor peripheral portion 150 and the second semiconductor substrate 142 can be electrically connected to the external part through the single pad 126. As shown in FIG. 37B, the pad 126 can be formed at another location. In FIGS. 37A and 37B, the cap 200 is not illustrated for a convenience of illustration.

The structures illustrated in FIGS. 1 through 37B are examples of the semiconductor physical quantity sensor of the present invention. The semiconductor physical quantity sensor of the present invention should not be limited to the illustrated structures. That is, the structures described in the embodiments can be combined in various other ways in possible manners. For example, the support substrate 140 and the cap 200 made of glass can be also employed in structures, other than the structure of the fourth embodiment shown in FIG. 15.

In the above-described embodiments, the sensor structure 110 is hermetically sealed by the cap 200 or the electrically insulating member 180. As another example, the sensor unit 100 can be housed in a case, which can be hermetically sealed, without employing the cap 200 and the electrically insulating member 180.

Additional advantages and modifications will readily occur to those skilled in the art. The invention in its broader term is therefore not limited to the specific details, representative apparatus, and illustrative examples shown and described.

What is claimed is:

1. A semiconductor physical quantity sensor comprising:
a sensor unit including:
   a support substrate having a surface made of an electrically insulating material;
   a first semiconductor substrate divided into a predetermined shape to include a sensor structure, a sensor peripheral portion and a connector portion, the sensor peripheral portion having a loop-shape entirely surrounding a periphery of the sensor structure and the connector portion;
a pattern portion disposed along a surface of the first semiconductor substrate, the pattern portion including a wiring pattern as a wiring and a peripheral pattern, the wiring pattern electrically connecting the sensor structure and the connector portion, and the peripheral pattern having a loop shape entirely surrounding a periphery of the sensor structure and the connector portion, and being electrically connected to the sensor peripheral portion, wherein the wiring pattern and the peripheral pattern are bonded to the surface of the support substrate to join the first semiconductor substrate and the support substrate to each other, and the peripheral pattern is located between the sensor peripheral portion and the support substrate;
a cap having a substantially plate shape and bonded to the first semiconductor substrate on an opposite side of the support substrate to hermetically seal the sensor structure;
a first penetrating electrode that passes through the support substrate in a layering direction in which the first semiconductor substrate and the support substrate are layered and is electrically connected to the wiring pattern, and
a third penetrating electrode that passes through the support substrate in a layering direction in which the first semiconductor substrate and the support substrate are layered, and is electrically connected to the sensor peripheral portion through the peripheral pattern.

2. The semiconductor physical quantity sensor according to claim 1, wherein
the support substrate includes a second semiconductor substrate and an electrically insulating layer disposed along a surface of the second semiconductor substrate so that the surface of the support substrate is provided by the electrically insulating layer,
the first semiconductor substrate includes an embedded portion in an area surrounded by the sensor peripheral portion,
the embedded portion is bonded to the electrically insulating layer through the pattern portion,
the sensor unit has an embedded wire that is disposed in a through hole passing through the embedded portion, the pattern portion disposed between the embedded portion and the electrically insulating layer, and the electrically insulating layer, and the embedded wire is electrically connected to the second semiconductor substrate, and
the cap has a portion bonded to the embedded portion, and
the semiconductor physical quantity sensor further comprising:
second penetrating electrode that passes through the cap in a layering direction in which the first semiconductor substrate and the support substrate are layered and is electrically connected to the embedded wire.

3. The semiconductor physical quantity sensor according to claim 1, wherein
the support substrate includes a second semiconductor substrate, a first electrically insulating layer disposed on a first surface of the second semiconductor substrate so that the surface of the support substrate is provided by the first electrically insulting layer, and a second electrically insulating layer disposed on a second surface of the second semiconductor substrate,
the semiconductor physical quantity sensor further comprising:
a second penetrating electrode that passes through the second electrically insulating layer and is electrically connected to the second semiconductor substrate.

* * * * *